United States Patent
Harari

(10) Patent No.: US 10,121,554 B2
(45) Date of Patent: Nov. 6, 2018

(54) MULTI-GATE NOR FLASH THIN-FILM TRANSISTOR STRINGS ARRANGED IN STACKED HORIZONTAL ACTIVE STRIPS WITH VERTICAL CONTROL GATES

(71) Applicant: Sunrise Memory Corporation, Los Gatos, CA (US)

(72) Inventor: Eli Harari, Saratoga, CA (US)

(73) Assignee: SUNRISE MEMORY CORPORATION, Los Gatos, CA (US)

(*) Notice: Subject to any disclaimer, the term of this patent is extended or adjusted under 35 U.S.C. 154(b) by 0 days.

(21) Appl. No.: 15/846,766

(22) Filed: Dec. 19, 2017

(65) Prior Publication Data

US 2018/0108423 A1 Apr. 19, 2018

Related U.S. Application Data

(62) Division of application No. 15/220,375, filed on Jul. 26, 2016, now Pat. No. 9,892,800.
(Continued)

(51) Int. Cl.
*G11C 16/34* (2006.01)
*H01L 29/66* (2006.01)
(Continued)

(52) U.S. Cl.
CPC ...... *G11C 16/3431* (2013.01); *G11C 11/5628* (2013.01); *G11C 11/5635* (2013.01);
(Continued)

(58) Field of Classification Search
CPC . G11C 16/3431; G11C 16/3427; G11C 16/26; G11C 16/0416; G11C 16/10;
(Continued)

(56) References Cited

U.S. PATENT DOCUMENTS 5,496,533 A 2/1996 Lambrache
5,525,529 A 6/1996 Guldi
(Continued)

OTHER PUBLICATIONS

International Search Report and Written Opinion of PCT Application No. PCT/US2016/044336 dated Dec. 12, 2016.
(Continued)

*Primary Examiner* — Son Dinh
*Assistant Examiner* — Jerome Leboeuf
(74) *Attorney, Agent, or Firm* — Edward C. Kwok, Esq.; VLP Law Group, LLP

(57) ABSTRACT

Multi-gate NOR flash thin-film transistor (TFT) string arrays ("multi-gate NOR string arrays") are organized as stacks of horizontal active strips running parallel to the surface of a silicon substrate, with the TFTs in each stack being controlled by vertical local word-lines provided along one or both sidewalls of the stack of active strips. Each active strip includes at least a channel layer formed between two shared source or drain layers. Data storage in the TFTs of an active strip is provided by charge-storage elements provided between the active strip and the control gates provided by the adjacent local word-lines. Each active strip may provide TFTs that belong to one or two NOR strings, depending on whether one or both sides of the active strip are used.

16 Claims, 17 Drawing Sheets

Related U.S. Application Data

(60) Provisional application No. 62/235,322, filed on Sep. 30, 2015.

(51) Int. Cl.

| | | |
|---|---|---|
| *G11C 11/56* | (2006.01) | |
| *G11C 16/04* | (2006.01) | |
| *H01L 27/11573* | (2017.01) | |
| *H01L 27/11582* | (2017.01) | |
| *G11C 16/10* | (2006.01) | |
| *G11C 16/26* | (2006.01) | |
| *G11C 16/28* | (2006.01) | |
| *H01L 21/28* | (2006.01) | |
| *H01L 27/06* | (2006.01) | |
| *H01L 29/792* | (2006.01) | |
| *H01L 27/11565* | (2017.01) | |

(52) U.S. Cl.
CPC ...... *G11C 16/0416* (2013.01); *G11C 16/0466* (2013.01); *G11C 16/0483* (2013.01); *G11C 16/0491* (2013.01); *G11C 16/10* (2013.01); *G11C 16/26* (2013.01); *G11C 16/28* (2013.01); *G11C 16/3427* (2013.01); *H01L 21/28282* (2013.01); *H01L 27/0688* (2013.01); *H01L 27/11573* (2013.01); *H01L 27/11582* (2013.01); *H01L 29/66833* (2013.01); *H01L 29/7926* (2013.01); *H05K 999/99* (2013.01); *H01L 27/11565* (2013.01)

(58) Field of Classification Search
CPC . G11C 16/28; G11C 16/0491; G11C 16/0466; G11C 11/05; H01L 29/66833; H01L 27/0688; H01L 29/7926; H01L 21/28282; H01L 27/11582
See application file for complete search history.

(56) References Cited

U.S. PATENT DOCUMENTS

| | | | |
|---|---|---|---|
| 5,768,192 | A | 6/1998 | Eitan |
| 6,363,389 | B1 | 3/2002 | Lyle et al. |
| 6,434,053 | B1 | 8/2002 | Fujiwara |
| 6,580,124 | B1 | 6/2003 | Cleeves et al. |
| 6,744,094 | B2 | 6/2004 | Forbes |
| 7,005,350 | B2 | 2/2006 | Walker et al. |
| 7,612,411 | B2 | 11/2009 | Walker |
| 7,714,377 | B2 | 5/2010 | Specht et al. |
| 8,026,521 | B1 | 9/2011 | Or-Bach et al. |
| 8,630,114 | B2 | 1/2014 | Lue |
| 8,878,278 | B2 | 11/2014 | Alsmeier et al. |
| 9,356,105 | B1 | 5/2016 | Lue |
| 2001/0053092 | A1 | 12/2001 | Kosaka |
| 2002/0136077 | A1 | 9/2002 | Spirkl |
| 2003/0038318 | A1 | 2/2003 | Forbes |
| 2004/0125629 | A1 | 7/2004 | Scheuerlein et al. |
| 2005/0128815 | A1 | 6/2005 | Ishikawa et al. |
| 2005/0218509 | A1 | 10/2005 | Kipnis et al. |
| 2008/0239812 | A1 | 10/2008 | Abiko et al. |
| 2008/0259683 | A1 | 10/2008 | Lisi et al. |
| 2008/0304317 | A1 | 12/2008 | Roohparvar |
| 2009/0279360 | A1 | 11/2009 | Lee et al. |
| 2010/0027355 | A1 | 2/2010 | Dao et al. |
| 2010/0124116 | A1 | 5/2010 | Maeda et al. |
| 2011/0044113 | A1 | 2/2011 | Kim et al. |
| 2011/0298013 | A1 | 12/2011 | Hwang |
| 2011/0309425 | A1 | 12/2011 | Purayath et al. |
| 2012/0163086 | A1 | 6/2012 | Yang et al. |
| 2012/0243314 | A1 | 9/2012 | Maeda |
| 2013/0001568 | A1 | 1/2013 | Yamazaki et al. |
| 2013/0250687 | A1 | 9/2013 | Chan |
| 2013/0286747 | A1 | 10/2013 | Kwak |
| 2014/0151774 | A1* | 6/2014 | Rhie ................ H01L 27/11573 257/314 |
| 2015/0054057 | A1 | 2/2015 | Hung et al. |
| 2016/0086970 | A1* | 3/2016 | Peng ................ H01L 27/11565 257/324 |
| 2017/0053906 | A1 | 2/2017 | Or-Bach et al. |

OTHER PUBLICATIONS

Lue, HT et al., "A Highly Scalable 8-Layer 3D Vertical-Gate (VG) TFT NAND Flash Using Junction-Free Buried Channel BE-SONOS Device", published in the 2010 Symposium on VLSI Technology Digest of Technical Papers, pp. 131-132.

Kim, W. et al., "Multi-Layered Vertical Gate NAND Flash Overcoming Stacking Limit for Terabit Density Storage", published in the 2009 Symposium on VLSI Technology Digest of Technical Papers, pp. 188-189.

Wann, H.C., "High-Endurance Ultra-Thin Tunnel Oxide in Monos Device Structure for Dynamic Memory Application", published in IEEE Electron Device letters, vol. 16, No. 11, Nov. 1995, pp. 491-493.

* cited by examiner

MULTI-GATE NOR FLASH THIN-FILM TRANSISTOR STRINGS ARRANGED IN STACKED HORIZONTAL ACTIVE STRIPS WITH VERTICAL CONTROL GATES

CROSS REFERENCE TO RELATED APPLICATIONS

The present application is a divisional of U.S. patent application Ser. No. 15/220,375, filed Jul. 26, 2016, entitled "Multi-Gate NOR Flash Thin-Film Transistor Strings Arranged In Stacked Horizontal Active Strips With Vertical Control Gates," which relates to and claims priority of U.S. provisional patent application Ser. No. 62/235,322, filed Sep. 30, 2015, entitled "Multi-Gate NOR Flash Thin-Film Transistor Strings Arranged In Stacked Horizontal Active Strips With Vertical Control Gates." Both Applications are hereby incorporated by reference in their entirety.

BACKGROUND OF THE INVENTION

1. Field of the Invention

The present invention relates to high-density memory structures. In particular, the present invention relates to high-density memory structures formed by interconnected thin-film storage elements, such as thin-film storage transistors.

2. Discussion of the Related Art

In this disclosure, memory circuit structures are described. These structures may be fabricated on planar semiconductor substrates (e.g., silicon wafers) using conventional fabrication processes. To facilitate clarity in this description, the term "vertical" refers to the direction perpendicular to the surface of a semiconductor substrate, and the term "horizontal" refers to any direction that is parallel to the surface of that semiconductor substrate.

A number of high-density non-volatile memory structures, sometimes referred to as "three-dimensional vertical NAND strings," are known in the prior art. Many of these high-density memory structures are formed using thin-film storage transistors formed out of deposited thin-films (e.g., polysilicon thin-films), and organized as arrays of "memory strings." One type of memory strings is referred to as NAND memory strings or simply "NAND strings". A NAND string consists of a number of series-connected storage transistors ("TFTs"). Reading or programming any of the series-connected TFTs requires activation of all series-connected TFTs in the NAND string. Under this NAND arrangement, the activated TFTs that are not read or programmed may experience undesirable program-disturb or read-disturb conditions. Further, TFTs formed out of polysilicon thin films have much lower channel mobility—and therefore higher resistivity—than conventional transistors formed in a single-crystal silicon substrate. The higher series resistance in the NAND string limits the number of TFTs in a string in practice to typically no more than 64 or 128 TFTs. The low read current that is required to be conducted through a long NAND string results in a long latency.

Another type of high density memory structures is referred to as the NOR memory strings or "NOR strings." A NOR string includes a number of storage transistors each connected to a shared source region and a shared drain region. Thus, the transistors in a NOR string are connected in parallel, so that a read current in a NOR string is conducted over a much lesser resistance than the read current through a NAND string. At the present time, the present inventor is not aware of any NOR string in the prior art that is formed out of TFTs. To read or program a storage transistor in a NOR string, only that storage transistor needs to be activated (i.e., "on" or conducting), all other storage transistors in the NOR string remain dormant (i.e., "off" or non-conducting). Consequently, a NOR string allows much faster sensing of the activated storage transistor to be read and avoids program-disturb or read-disturb conditions in the other storage transistors of the NOR string that are not read or programmed.

Three-dimensional memory structures are disclosed, for example, in U.S. Pat. No. 8,878,278 to Alsmeier et al. ("Alsmeier"), entitled "Compact Three Dimensional Vertical NAND and Method of Making Thereof," filed on Jan. 30, 2013 and issued on Nov. 4, 2014. Alsmeier discloses various types of high-density NAND memory structures, such as "terabit cell array transistor" (TCAT) NAND arrays (FIG. 1A), "pipe-shaped bit-cost scalable" (P-BiCS) flash memory (FIG. 1B) and a "vertical NAND" memory string structure. Likewise, U.S. Pat. No. 7,005,350 to Walker et al. ("Walker I"), entitled "Method for Fabricating Programmable Memory Array Structures Incorporating Series-Connected Transistor Strings," filed on Dec. 31, 2002 and issued on Feb. 28, 2006, also discloses a number of three-dimensional high-density NAND memory structures.

U.S. Pat. No. 7,612,411 to Walker ("Walker II"), entitled "Dual-Gate Device and Method" filed on Aug. 3, 2005 and issued on Nov. 3, 2009, discloses a "dual gate" memory structure, in which a common active region serves independently controlled storage elements in two NAND strings formed on opposite sides of the common active region.

U.S. Pat. No. 6,744,094 to Forbes ("Forbes"), entitled "Floating Gate Transistor with Horizontal Gate Layers Stacked Next to Vertical Body" filed on Aug. 24, 2001 and issued on Jun. 1, 2004, discloses memory structures having vertical body transistors with adjacent parallel horizontal gate layers.

U.S. Pat. No. 6,580,124 to Cleaves et al, entitled "Multigate Semiconductor Device with Vertical Channel Current and Method of Fabrication" filed on Aug. 14, 2000 and issued on Jun. 17, 2003, discloses a multibit memory transistor with two or four charge storage mediums formed along vertical surfaces of the transistor.

A three-dimensional memory structure, including horizontal NAND strings that are controlled by vertical polysilicon gates, is disclosed in the article "Multi-layered Vertical gate NAND Flash Overcoming Stacking Limit for Terabit Density Storage" ("Kim"), by W. Kim at al., published in the 2009 Symposium on VLSI Tech. Dig. Of Technical Papers, pp 188-189. Horizontal 3D NAND strings with vertical poly gates. Another three-dimensional memory structure, also including horizontal NAND strings with vertical polysilicon gates, is disclosed in the article, "A Highly Scalable 8-Layer 3D Vertical-gate (VG) TFT NAND Flash Using Junction-Free Buried Channel BE-SONOS Device," by H. T. Lue et al., published in the 2010 Symposium on VLSI: Tech. Dig. Of Technical Papers, pp.131-132.

In the memory structures discussed herein, stored information is represented by the stored electric charge, which may be introduced using any of a variety of techniques. For example, U.S. Pat. No. 5,768,192 to Eitan, entitled "Non-Volatile Semiconductor Memory Cell Utilizing Asymmetrical Charge Trapping," filed on Jul. 23, 1996 and issued on Jun. 16, 1998, discloses NROM type memory transistor operation based on a "hot electron channel injection" technique. Other techniques include Fowler-Nordheim tunneling used in TFT NAND strings, and direct tunneling, both of which are known to those of ordinary skill in the art.

SUMMARY

According to one embodiment of the present invention, multi-gate NOR flash thin-film transistor (TFT) string arrays ("multi-gate NOR string arrays") are organized as stacks of horizontal active strips running parallel to the surface of a silicon substrate, with the TFTs in each stack being controlled by vertical local word-lines provided along one or both sidewalls of the stack of active strips. Each active strip includes at least a channel layer formed between two shared source or drain layers. Data storage in the TFTs of an active strip is provided by charge-storage elements provided between the active strip and the control gates provided by the adjacent local word-lines. Each active strip may provide TFTs that belong to one or two NOR strings, depending on whether one or both sides of the active strip are used.

In one embodiment, only one of the shared source or drain layers in an active strip is connected to a supply voltage, while the other source or drain layer is held at a voltage determined by a quantity of charge deposited in the source or drain layer. Prior to a read, write or erase operation, the TFTs that are not to be activated act as a strip capacitor, with one plate being the source or drain layer itself and the other plate being the control gate electrodes in the NOR string that are referenced to a ground reference. The charge on the strip capacitor is provided by one or more pre-charge TFTs that are activated momentarily to transfer charge to the strip capacitor from a supply voltage connected to the contacted source or drain layer.

In one embodiment, TFTs are formed on both vertical side edges of each active strip, so that vertical local word-lines may be provided along both vertical side edges of the active strips. In that embodiment, double-density is achieved by having the local word-lines along one of vertical edges of an active strip be contacted by horizontal global word-lines provided above the active strip, while the local word-lines along the other vertical edge of the active strip be contacted by horizontal global word-lines provided beneath the active strip. All global word-lines may run in a direction perpendicular to the direction of the corresponding active strips. Even greater storage density may be achieved by storing more than one bit of data in each TFT.

Organizing the TFTs into NOR strings—rather than the prior art NAND strings—results in (i) a reduced read-latency that approaches that of a dynamic random access memory (DRAM) array, (ii) reduced sensitivities to read-disturb and program-disturb conditions that are associated with long NAND strings, and (iii) reduced power dissipation and lower costs, relative to planar NAND or 3D NAND arrays.

According to one embodiment of the present invention, variations in threshold voltages within a block of NOR strings may be compensated by providing electrically programmable reference strings within the block. Effects on a read operation due to background leakage currents inherent to multi-gate NOR strings can be substantially eliminated by comparing the sensed result of the TFT being read and that of a concurrently read TFT on a reference NOR string. In other embodiments, the charge-storing element of each TFT may have its structure modified to provide a high write/erase cycle endurance, albeit a lower retention time that requires refreshing. However, as such refreshing is required significantly less frequently than a conventional dynamic random access memory (DRAM) circuit, the NOR string arrays of the present invention may operate in some DRAM applications. Such use of the NOR strings allows a substantially lower cost-per-bit figure of merit, as compared to the conventional DRAMs, and a substantially lower read-latency, as compared to conventional NAND string arrays.

The present invention is better understood upon consideration of the detailed description below, in conjunction with the accompanying drawings.

BRIEF DESCRIPTION OF THE DRAWINGS

FIG. 2b-2 shows structure 220b, which includes additional metallic sublayer 224 adjacent one of layers 221 and 223 of structure 220a, in accordance with one embodiment of the present invention.

FIG. 2b-3 shows structure 220c, which includes additional metallic sublayer 224 adjacent each of layers 221 and 223 of structure 220a, in accordance with one embodiment of the present invention.

FIG. 2d illustrates forming trenches 230 in memory structure 200 of FIG. 2a, in a cross section in an X-Y plane through active layer 202-7 in one portion of memory structure 200 of FIG. 2a.

FIG. 2e illustrates depositing charge-trapping layers 231L and 231R on opposite side walls of the active strips along trenches 230, in a cross section in an X-Y plane through active layer 202-7 in one portion of memory structure 200 of FIG. 2a.

FIG. 3 illustrates the methods and circuit elements used for setting a source voltage ($V_{ss}$) on source lines in N+ sublayer 221; specifically, the source line voltage may be set through hard-wire decoded source line connection 280 or using pre-charge TFTs 303 and bit-line connections 270.

DETAILED DESCRIPTION OF THE PREFERRED EMBODIMENTS

Figure 1A:
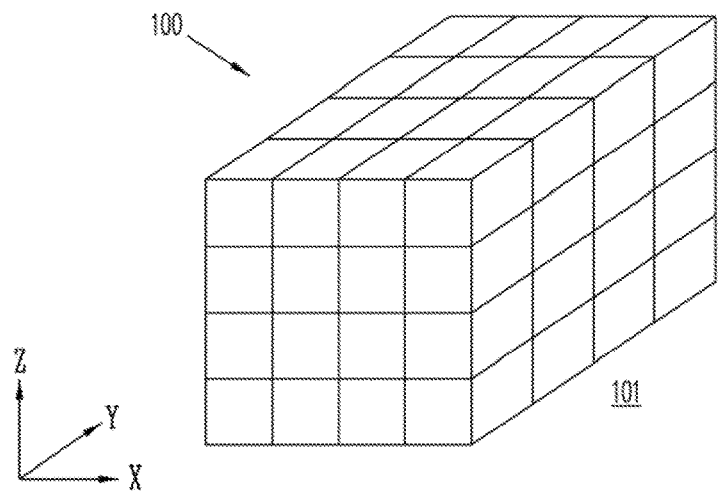
FIG. 1a shows a conceptualized memory structure 100 which illustrates an organization of memory cells according to one embodiment of the present invention.

FIG. 1a shows a conceptualized memory structure 100 that facilitates illustration in this detailed description of an organization of memory cells according to one embodiment of the present invention. As shown in FIG. 1a, memory structure 100 represents a 3-dimensional block of memory cells formed in deposited thin-films over the surface of substrate layer 101. Substrate layer 101 may be, for example, a conventional silicon wafer used for fabricating integrated circuits, familiar to those of ordinary skill in the art. In this detailed description, a Cartesian coordinate system (such as indicated in FIG. 1a) is adopted solely for the purpose of facilitating discussion. Under this coordinate system, the surface of substrate layer 101 is considered a plane which is parallel to the X-Y plane. Thus, as used in this description, the term "horizontal" refers to any direction parallel to the X-Y plane, while "vertical" refers to the Z-direction.

In FIG. 1a, each vertical column represents storage elements (i.e., thin-film storage transistors or TFTs) that share a vertical common control gate or word-line in a stack of horizontal NOR strings, with each NOR string running along the Y direction. Each NOR string is formed out of TFTs along an "active strip", described in further detail below. Unlike a NAND string, in a NOR string, writing, reading or erasing one of its TFTs does not involve activation of other TFTs in the NOR string. As shown in FIG. 1a, memory structure 100 represents an array consisting of 4 stacks of NOR strings, with each stack having four NOR strings, and each NOR string having four TFTs. Note that, as a conceptualized structure, memory structure 100 is merely an abstraction of certain salient characteristics of a memory structure of the present invention. Although shown in FIG. 1a as an array of 4×4 NOR strings, each having four TFTs, a memory structure of the present invention may have any number of TFTs along any of the X, Y and Z directions. For example, there may be 2, 4, 8, 16, 32, 64, . . . NOR-type strings along each of the X and Z directions, with each NOR string may have 2, 4, 8, 16, . . . 8192 or more TFTs. The use of numbers that are integer powers of 2 (i.e., $2^n$, where n is an integer) follows a customary practice in conventional memory design. It is customary to access each addressable unit of memory by decoding a binary address. Thus, for example, a memory structure within the scope of the present invention may have M NOR strings along each of the X and Z directions, with M being a number that is not necessarily $2^n$, for any integer n. If memory block 100 has 8192 stacks of 8 NOR strings each, with each NOR string having 8192 storage elements, memory block 100 would have more than half a billion storage elements in the form of NOR-type nonvolatile TFTs. As it is not uncommon today to store more than one bit in a storage element using a multi-level cell (MLC) technique, memory block 100 can store more than one billion bits of information. A one-terabit memory chip would have one thousand or more such blocks plus spare blocks available to substitute defective or worn-out blocks.

As a conceptualized structure, memory structure 100 is not drawn to scale in any of the X, Y, Z directions.

Figure 1B:
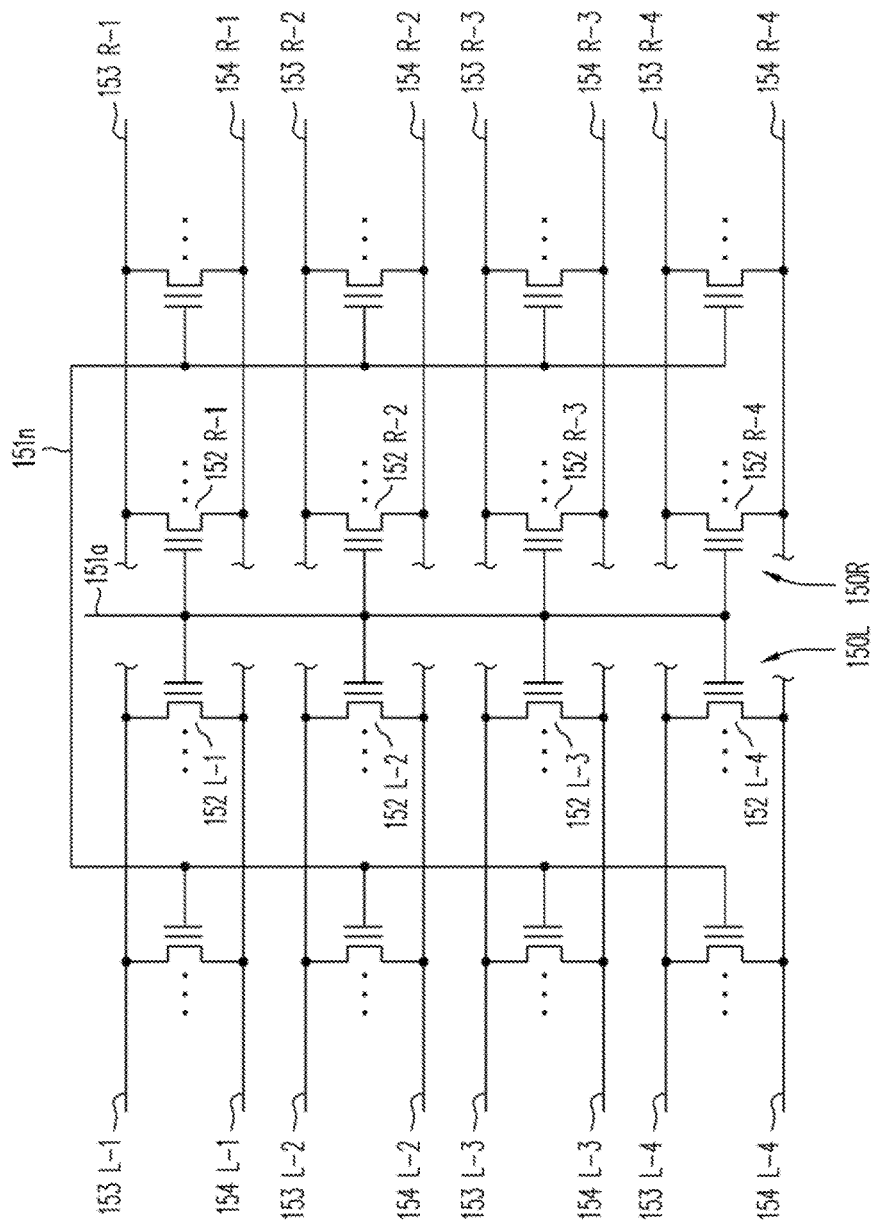
FIG. 1b shows a basic circuit representation of two stacks of NOR strings sharing common vertical word-lines, according to one embodiment of the present invention.
Figure 1C:
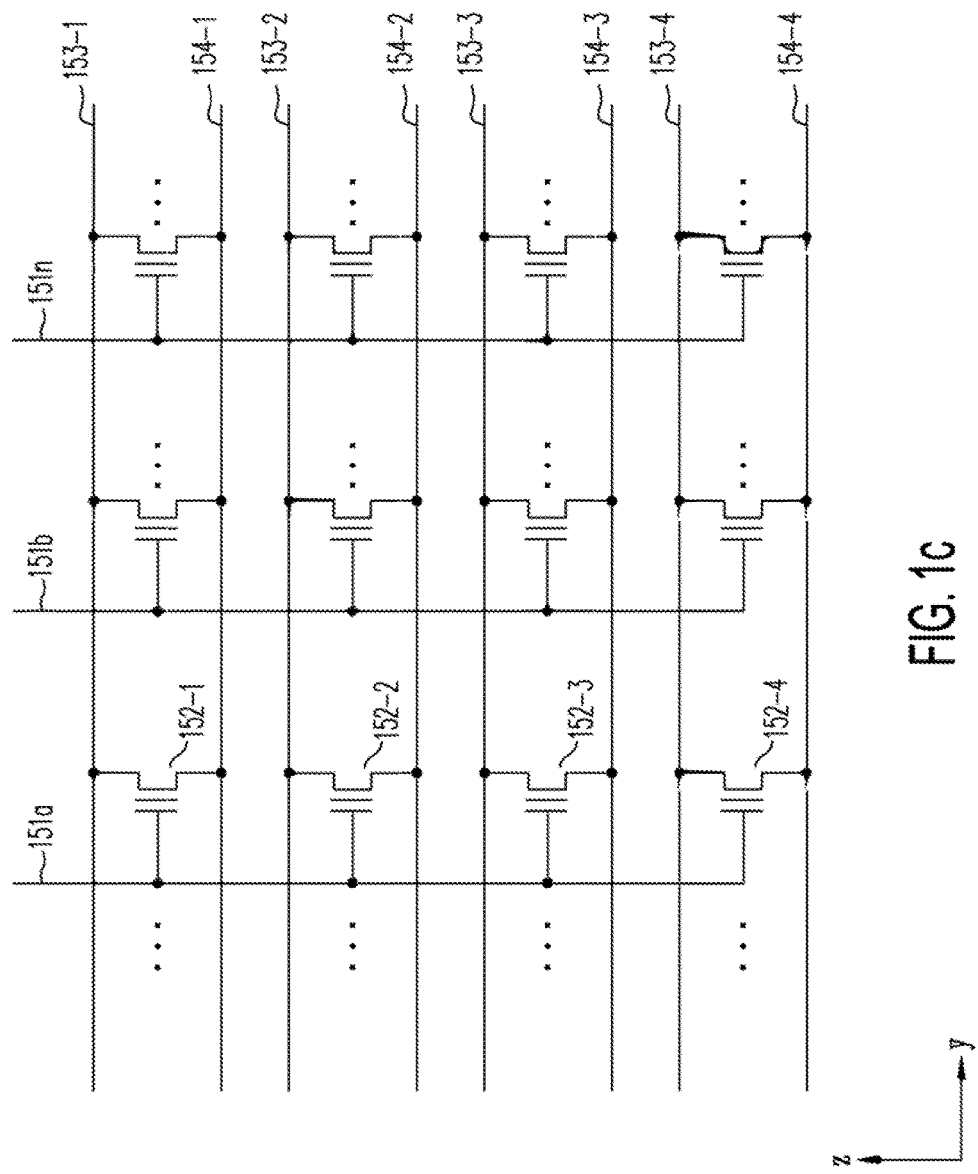
FIG. 1c shows a basic circuit representation of a stack of four NOR strings in a Y-Z plane cross section of conceptualized memory structure 100.

FIG. 1c shows a basic circuit representation of a stack of 4 NOR strings in a Y-Z plane cross section of conceptualized memory structure 100. As shown in FIG. 1c, each NOR string runs along the Y direction, with storage elements connected between source line 153-m and bit lines 154-m, where m is the index between 1 to 4 of the corresponding active strip. Corresponding storage elements in the 4 NOR strings are connected corresponding vertical word-lines 151-n, where n is the index of the word-lines along the active strips.

FIG. 1b shows a basic circuit representation of two stacks of NOR strings sharing common vertical word-lines, according to one embodiment of the present invention. The detailed structure of this configuration is discussed and illustrated below in conjunction with FIG. 2k. As shown in FIG. 1b, this basic circuit configuration includes NOR strings (e.g., NOR strings 150L and 150R) that are provided in adjacent columns of memory structure 100 sharing a common word-line.

As shown in FIG. 1b, NOR strings 150L and 150R are NOR strings in two active strips located on opposite sides of common word-line 151a. Storage transistors 152R-1 to 152R-4 and 152L-1 to 152L-4 are storage elements in the four active strips to the right and in the four active strips to the left of their common vertical word-line 151a, respectively. In this embodiment, as illustrated in greater detail below in conjunction with FIG. 2k and FIG. 4c, a greater storage density may be achieved by having a common local word-line to control TFTs of adjacent active strips. For example, word-line 151n controls TFTs in the NOR strings of bit lines 153R-1, 153R-2, 153R-3 and 153R-4, and TFTs in the NOR strings of bit lines 153L-1, 153L-2, 153L-3 and 153L-4. As discussed in greater detail below, in one embodiment, the parasitic capacitance C intrinsic to each NOR string (e.g., the parasitic capacitance between the N+ diffusions of a string and its numerous associated local word-lines) may be used, under some operating conditions, to provide a virtual voltage source.

The TFTs in the NOR strings of the present invention may be programmed, program-inhibited, erased, or read using conventional programming, inhibition, erasure and read voltages. In one or more embodiments of the present invention, the TFTs are implemented by thin-film storage transistors that are programmed or erased using Fowler-Nordheim tunneling or direct tunneling mechanisms. In another embodiment channel hot electron injection may be used for programming.

Figure 2A:
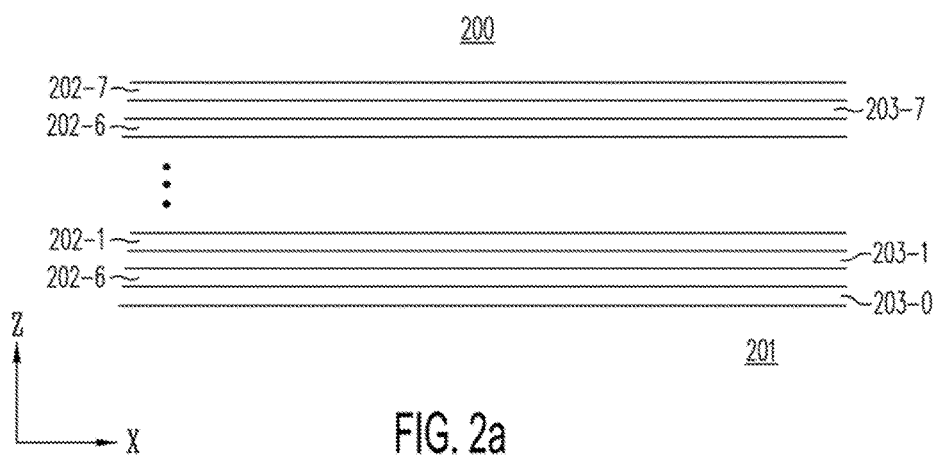
FIG. 2a shows a cross section in an Y-Z plane of memory structure 200, after active layers 202-0 to 202-7 have been formed on semiconductor substrate 201, but prior to formation of individual active strips, in accordance with one embodiment of the present invention.

FIG. 2a shows a cross section in an Y-Z plane of memory structure 200, after active layers 202-0 to 202-7 are formed on semiconductor substrate 201, in accordance with one embodiment of the present invention. As shown in FIG. 2a, memory structure 200 includes active layers 202-0 to 202-7. Semiconductor substrate 201 represents, for example, a P-doped bulk silicon wafer on which support circuits for memory structure 200 may be formed prior to forming the active layers. Such support circuits may include both analog and digital circuits. Some examples of such support circuits may include shift registers, latches, sense amplifiers, reference cells, power supply lines, bias and reference voltage generators, inverters, Nand, Nor, Exclusive-Or and other logic gates, input/output drivers, address decoders, including bit-line and word-line decoders, other memory elements, sequencers and state machines. These support circuits may be formed out of the building blocks of conventional devices, e.g., N-Wells, P-Wells, triple wells, $N^+$, $P^+$ diffusions, isolation regions, low and high voltage transistors, capacitors, resistors, and interconnects, as known to those skilled in the art.

After the support circuits have been formed in and on semiconductor substrate 201, insulating layer 203-0 is provided, which may be a deposited or grown thick silicon oxide, for example.

Next, in some embodiments, one or more layers of interconnect may be formed, including "global word-lines," which are discussed below. Such metallic interconnect lines (e.g., global word-line landing pads 264 of FIG. 2c, discussed below) may be provided as horizontal long narrow strips running along a predetermined direction that is perpendicular to the active NOR strings to be formed at a later step. To facilitate discussion in this detailed description, the global word-lines are presumed to run along the X direction. The metallic interconnect lines may be formed by applying photo-lithographical patterning and etching steps on one or more deposited metal layers. (Alternatively these metallic interconnect lines can be formed using a conventional damascene process, such as a copper damascene process). Thick oxide 203-0 is then deposited, followed by a planarization step using conventional chemical mechanical polishing (CMP).

Active layers 202-0 to 202-7 are then successively formed, each active layer being insulated from previous active layer underneath by a corresponding one of insulating layers 203-1 to 203-7. In FIG. 2a, although eight active layers are shown, any number of active layers may be provided. In practice, the number of active layers to provide may depend on the process technology, such as availability of a well-controlled anisotropic etching process that allows cutting through the active layers to reach semiconductor substrate 201. Each active layer is etched at an etching step discussed below to form a large number of parallel active strips each running along the Y direction.

Figures 1, 2B:
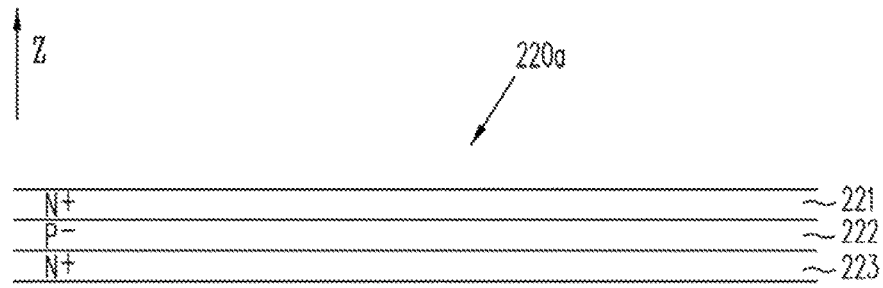
FIG. 2b-1 shows structure 220a, which may be used to implement any of active layers 202-0 to 202-7 of FIG. 2a, in accordance with one embodiment of the present invention.

FIG. 2b-1 shows structure 220a, which may be used to implement any of active layers 202-0 to 202-7 of FIG. 2a, in accordance with one embodiment of the present invention. As shown in FIG. 2b-1, active layer 220a includes deposited polysilicon sublayers 221-223. Sublayers 221-223 may be deposited successively in the same process chamber without removal in between. Sublayer 223 may be formed by depositing 5-50 nm of in-situ doped $N^+$ polysilicon. Sublayers 222 and 221 may then be formed by depositing undoped or lightly doped polysilicon, in the thickness range of 40-100 nm. Sublayer 221 (i.e., the top portion of the deposited polysilicon) is then $N^+$ doped. This $N^+$ doping may be achieved by either (i) a low-energy shallow ion implantation of arsenic or antimony, forming a 20-50 nm N+ doped top sublayer 221, or (ii) in-situ doping of the deposited polysilicon, forming a 20-50 nm $N^+$ top sublayer 221. (Thermal diffusion should not be used, as it would expose the lower active layers formed earlier to greater diffusion than the upper active layers). A low-dose implantation of boron (P−) or phosphorus (N−) ions may also be carried out at an energy sufficient to penetrate the implanted or in-situ $N^+$ doped sublayer 221, so as to adjust to an enhancement mode threshold voltage for sublayer 222 lying between top N+ doped sublayer 221 and bottom N+ doped sublayer 223.

Thermal activation of the N+ and P− implanted species in sublayers 221 and 222 should preferably take place after all active layers 202-0 to 202-7 have been formed, using a conventional rapid thermal annealing technique (e.g., at 700° C. or higher), thereby ensuring that all active layers experience high temperature processing in roughly the same amount. Caution must be exercised to limit the total thermal budget, so as to avoid merging $N^+$ sublayer 223 with the N+ sublayer 221, so as not to eliminate $P^-$ sublayer 222. $P^-$ sublayer 222 is required to remain sufficiently thick to avoid N+P−N+ transistor punch-through at a low voltage applied across N+ sublayers 221 and 223.

The final thickness of sublayer 222 represents the TFT channel length, which may be as little as 10 nm or less over long active strips. In one embodiment, it is possible to control the TFT channel length to less than 10 nm by depositing an ultra-thin (around 1 nm) film of silicon nitride (e.g., SiN or $Si_3N_4$), or another suitable diffusion-blocking film following the formation of $N^+$ sublayer 223, and then again following deposition of the polysilicon of sublayer 222 in a thickness range between 5-30 nm, before depositing N+ polysilicon sublayer 221. The ultra-thin silicon nitride layers can be deposited by chemical vapor deposition, atomic layer deposition or any other means, e.g., high pressure nitridization at low temperature. Each ultra-thin silicon nitride layer acts as a diffusion-barrier that prevents the $N^+$ dopants in $N^+$ sublayers 221 and 223 from diffusing into $P^-$ sublayer 222, yet are sufficiently thin to only marginally impede MOS transistor action in the region between N+ sublayer 221 (acting as a source) and N+ sublayer 223 (acting as a drain). (Electrons in the surface inversion layer of sublayer 222 readily tunnel directly through 1 nm of silicon nitride). These additional ultra-thin silicon nitride layers increase the manufacturing cost, but serve to significantly reduce leakage current in the numerous TFTs along the active strips that are in the "off" state, while providing a high read current for the accessed TFT that is in the "on" state.

Figures 2, 2B:
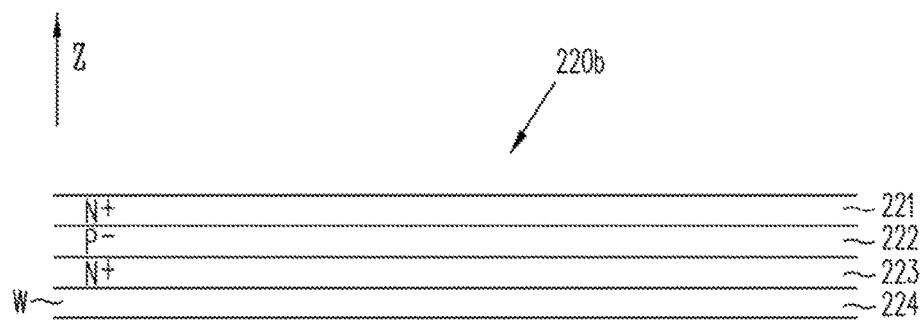
Figures 2, 2B, 3:
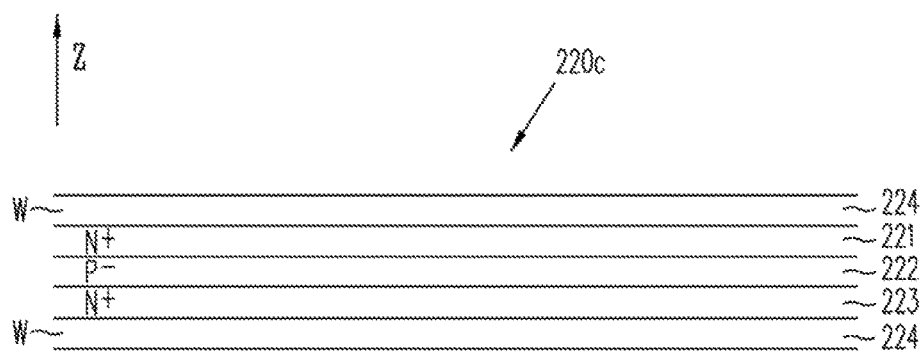

Optionally, to provide lower resistivity along the bit lines and the source lines of $N^+$ sublayers 223 and 221, additional conductive sublayer 224 may be provided adjacent the corresponding one of $N^+$ sublayers 221 and 223 (e.g., w in FIG. 2b-2), or both (e.g., FIG. 2b-3). Sublayer 224 may be provided by one or more deposited metal layers. For example, sublayer 224 may be provided by first depositing 1-2 nm thick layer of TiN, followed by depositing a 10-40 nm thick layer of tungsten or a similar refractory metal, or its silicide or salicide. Reduced line resistance is desirable for reducing the "RC delay" of a signal traversing a long conductive strip (i.e., the time delay due to the product of the line resistance R and the line capacitance C), and for minimizing the "IR drop" across a long and narrow active strip (i.e., the voltage drop due to the product of the current I and the line resistance R). Inclusion of metal sublayer 224 in each of active layers 202-0 to 202-7 may, however, increase cost and complexity in the manufacturing process, including the complication that some of the metallic materials are relatively more difficult to anisotropically etch than materials such as polysilicon or silicon oxide in the other sublayers. However, the use of metal sublayer 224 enables use of considerably longer active strips which result in superior array efficiency. On the other hand, shorter active strips have superior immunity to leakage between N+ sublayer 223 and N+ sublayer 221, and lower intrinsic capacitance than the longer strips. The integrated circuit designer may opt for a shorter active strip (with or without one or both metal layers) when low latency is most valued. Alternatively the strip resistance may be reduced by providing buried contacts at both ends, of each active strip, rather than just at one end.

Block-formation patterning and etching steps define separate blocks in the active layers formed. Each block defines an area in which a large number (e.g., thousands) of active strips running in parallel along the Y direction may be formed, as discussed below, with each active strip eventually forming a large number (e.g., thousands) of TFTs.

Each of active layers 202-0 to 202-7 is successively formed, with each active layer being formed by repeating the steps described above. In addition, in the block-formation patterning that defines the blocks of each active layer, each next higher active layer extends slightly beyond the previous active layer (see, e.g., as illustrated in FIG. 2c, discussed below, layer 202-1 extends beyond layer 202-0) to allow the higher active layer to access its specific decoders and other circuitry in semiconductor substrate 201 through designated buried contacts.

Figure 2C:
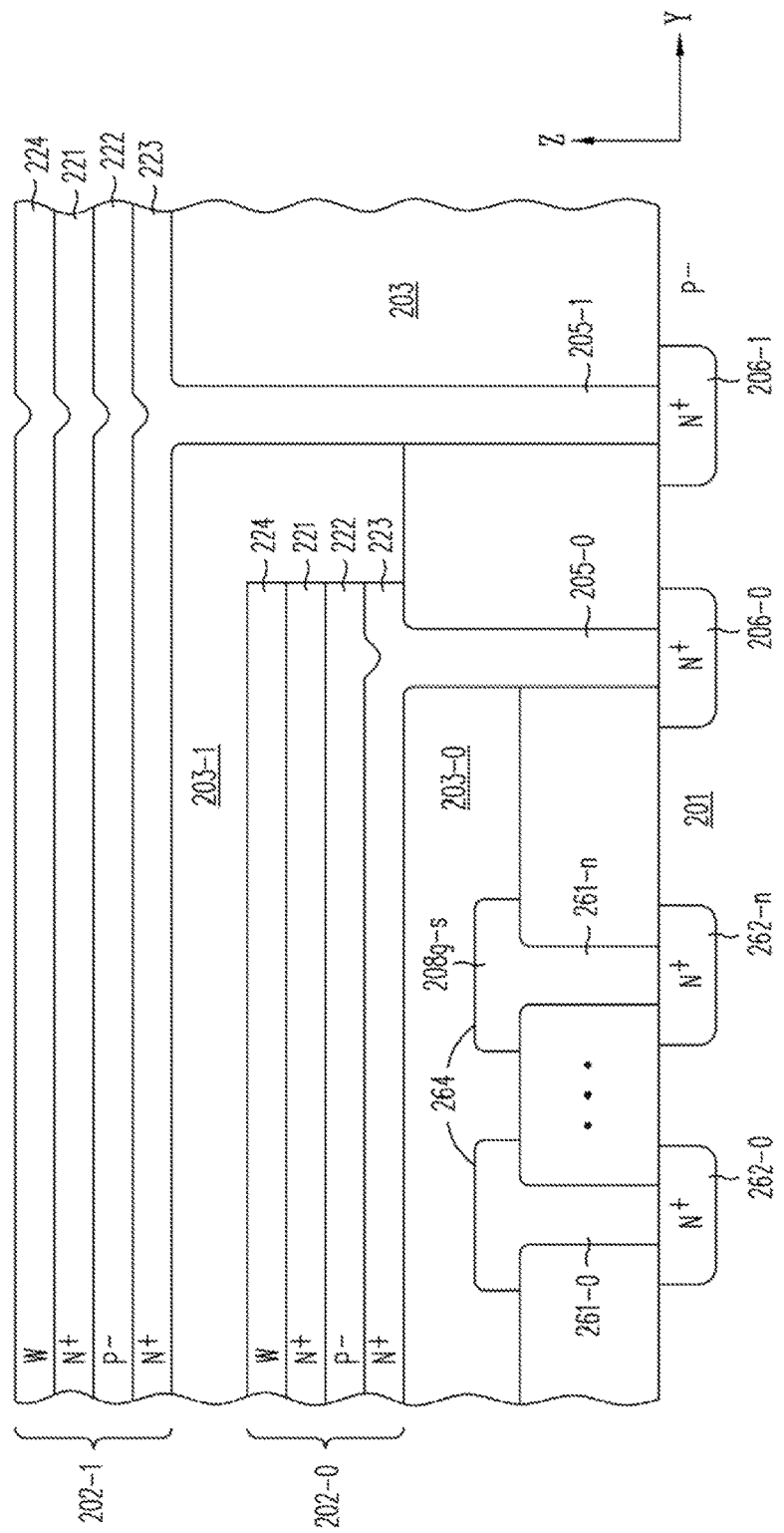
FIG. 2c shows a cross section in an Y-Z plane through buried contacts 205-0 and 205-1, which connect $N^+$ sublayer 223 in each of active layers 202-0 and 202-1 to contacts 206-0 and 206-1 in semiconductor substrate 201.

FIG. 2c shows a cross section in an Y-Z plane through buried contacts 205-0 and 205-1, which connect N+ sublayer 223 in each of active layers 202-0 and 202-1 to contacts 206-0 and 206-1 in semiconductor substrate 201. As shown in FIG. 2c, buried contacts 205-0 and 205-1 connect contacts 206-0 and 206-1 in semiconductor substrate 201, for example, to the local bit or source lines formed out of N+ sublayer 223 in each of active layers 202-0 and 202-1. Buried contacts for active layers 202-2 to 202-7 (not shown) may be similarly provided to connect active layers 202-2 to 202-7 to contacts 206-2 to 206-7 (not shown) in semiconductor substrate 201. Through a switch circuit, each of contacts 206-0 to 206-7 may apply a pre-charge voltage $V_{b1}$ to the respective bit line or source line or, during a read operation, may be connected to an input terminal of a sense amplifier or a latch. The switch circuit may selectively connect each of contacts 206-0 to 206-7 to any of a number of specific voltage sources, such as a programming voltage ($V_{program}$), an inhibit voltage ($V_{inhibit}$), an erasure voltage ($V_{erase}$), or any other suitable predetermined or pre-charge reference voltage $V_{b1}$ or $V_{ss}$. In one embodiment, discussed below, using the relatively large parasitic capacitance C along a bit line or source line, a virtual ground may be created in sublayer 221 of each active layer. In that embodiment, buried contacts and separate interconnects need not be provided to the bit or source lines formed out of N+ sublayer 221 in each of active layers 202-0 to 202-7.

FIG. 2c also shows buried contacts 261-0 to 261-n for connecting global word-lines —which are to be formed running along the X direction—to contacts 262-0 to 262-n in semiconductor substrate 201. These global word-lines are provided to connect corresponding local word-lines 208w to be formed (see, e.g., FIG. 2g, which is described below). Landing pads 264 are provided to allow connection to local word-lines 208w, which are yet to be formed vertically on top of global word-lines 261-0 and 261-n. Through a switch circuit and a global word-line decoder, each of global word-lines 262-0 to 262-n may be selectively connected, either individually, or shared among several global word-lines to any one of a number of reference voltage sources, such as stepped programming voltage ($V_{program}$), a read voltage ($V_{read}$) and an erasure voltage ($V_{erase}$).

These buried contacts, the global word-lines and the landing pads may be formed using conventional photolithographical patterning and etching steps, following by deposition of one or more conductors or by alloying (e.g., tungsten metal or tungsten silicide).

After the top active layer (e.g., active layer 202-7) is formed, trenches are created by etching through the active layers to reach the bottom global word-lines (or semiconductor substrate 201) using a strip-formation mask. The strip-formation mask consists of a pattern in a photoresist layer of long narrow strips running along the Y direction (i.e., perpendicular to that of global word-line strips that run along the X direction). Sequential anisotropic etches etch through active layers 202-7 down to 202-0, and dielectric isolations layers 203-7 down to 203-0. As the number of active layers to be etched, which is eight in the example of FIG. 2c (and, more generally may be 16 or more active layers), a photoresist mask by itself may not be sufficiently robust to hold the strip pattern through the numerous etches necessary to etch through the lowest active layer. Thus, reinforcement by a hard mask material, such as carbon, may be required, as is known to those of ordinary skill in the art. Etching terminates at the dielectric isolation above the landing pads of the global word-lines. It may be advantageous to provide an etch-stop barrier film such as aluminum oxide to protect the landing pads during the trench etch sequence.

Figure 2D:
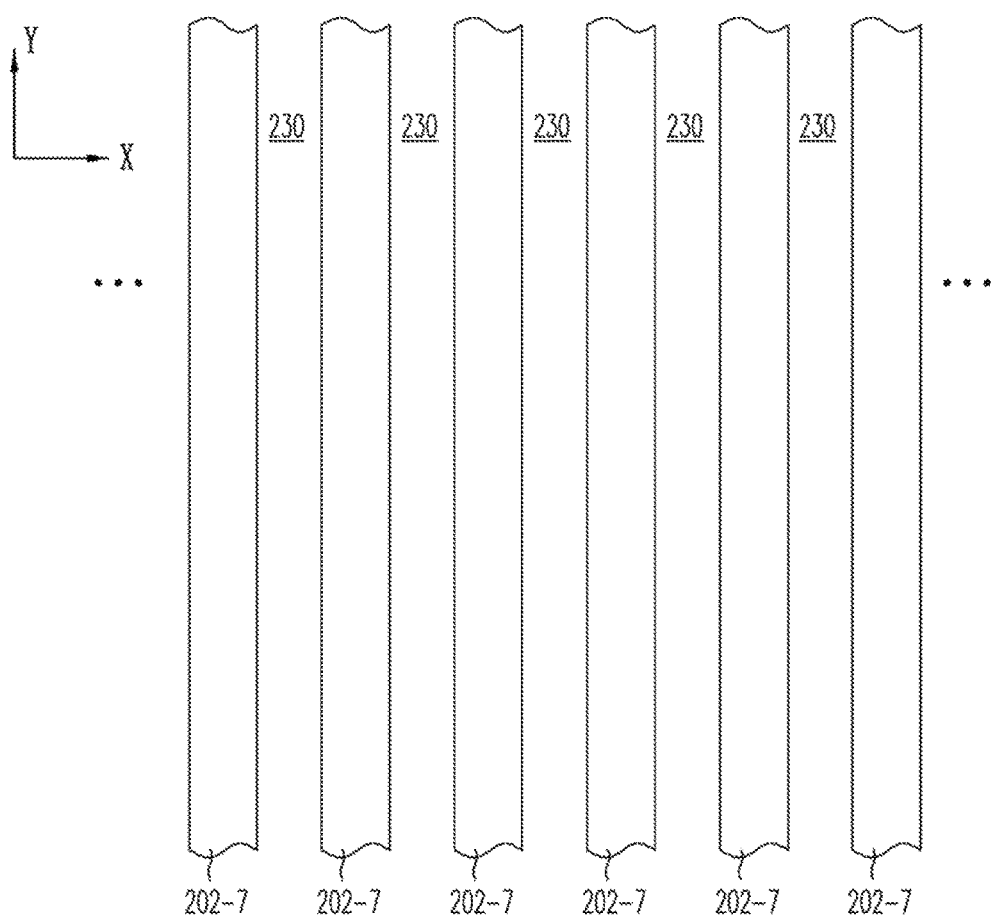

FIG. 2d illustrates forming trenches 230 in memory structure 200 of FIG. 2a, in a cross section in an X-Y plane through active layer 202-7 in one portion of memory structure 200 of FIG. 2a. Between adjacent trenches 230 is a stack of high aspect-ratio, long and narrow active strips. To achieve the best etch result, etch chemistry may have to be changed when etching through the materials of the different sublayers, especially when metal sublayers 224 are present. The anisotropy of the multi-step etch is important, as undercutting of any sublayer should be avoided as much as possible, and so that an active strip in the bottom active layer (e.g., an active strip in active layer 202-0) has approximately the same width and gap spacing to an adjacent active strip as the corresponding width and gap spacing in an active strip of the top active layer (i.e., an active strip of active layer 202-7). Naturally, the greater the number of active layers in the stack to be etched, the more challenging is the design of the successive etches. To alleviate the difficulty associated with etching through, for example, 32 active layers, etching may be conducted in sections of, say 8 layers each, as discussed in Kim, mentioned above, at pp. 188-189. As shown in FIG. 2d, trenches 230 run along the Y direction.

Figure 2E:
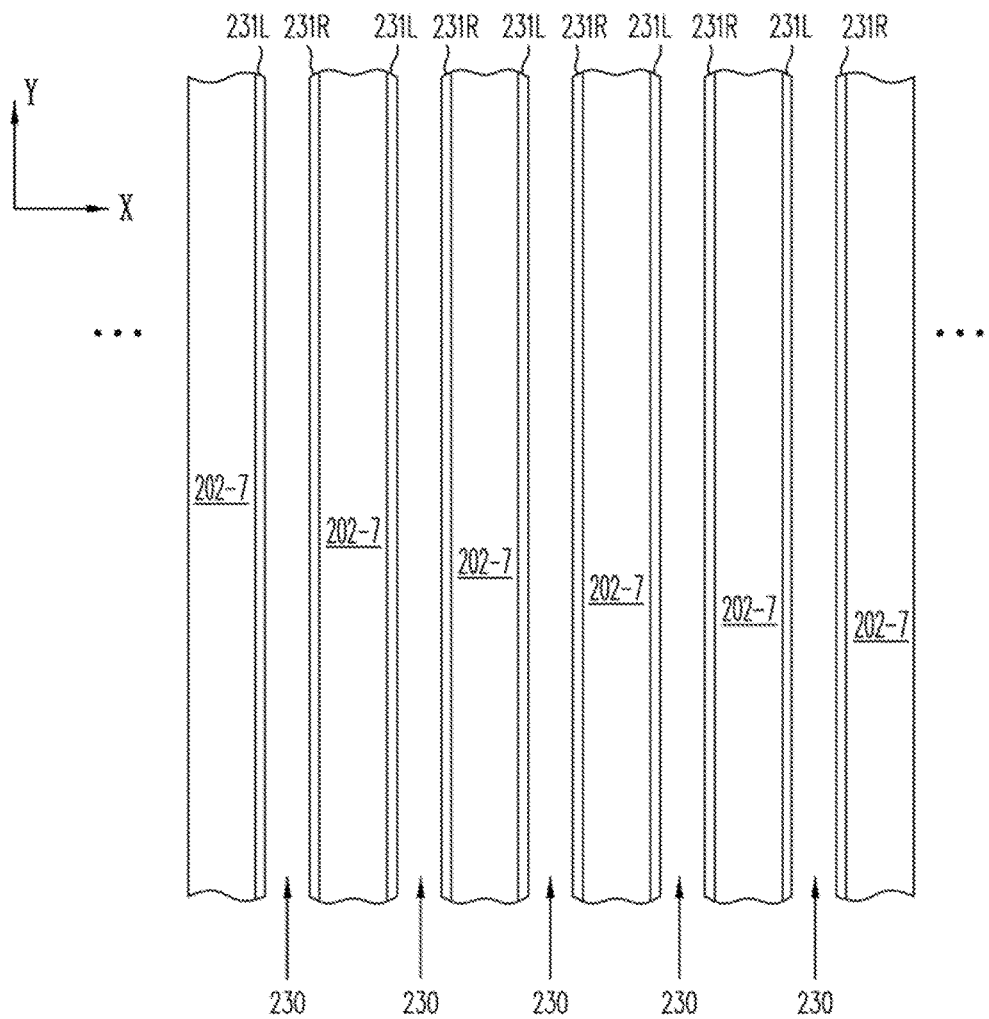

Thereafter, one or more layers of charge-trapping material are conformally deposited on the sidewalls of the active strips in trenches 230. The charge-trapping layer is formed by first depositing or growing a thin tunneling dielectric film of a 2-10 nm thickness, typically a silicon dioxide layer or a silicon oxide-silicon nitride-silicon oxide ("ONO") triple layer, followed by deposition of a 4-10 nm thick layer of charge-trapping material, typically silicon nitride or silicon-rich nitride or oxide or nanocrystals or nanodots embedded in a thin dielectric film, which is then capped by a blocking dielectric. The blocking dielectric may be a 5-15 nm thick layer consisting, for example, of an ONO layer, or a high dielectric constant film, such as aluminum oxide, hafnium oxide or some combination thereof. The storage element can be SONOS, TANOS, nanodot storage, isolated floating gates or any suitable charge-trapping sandwich structures known to those of ordinary skill in the art. Trenches 230 must be sufficiently wide to accommodate the storage elements on the two opposing sidewalls of the adjoining active strips, plus the vertical local word-lines to be shared by the TFT's on these opposite sidewalls. FIG. 2e illustrates deposited charge-trapping layers 231L and 231R on opposite side walls of the active strips along trenches 230, in a cross section in an X-Y plane through active layer 202-7 in one portion of memory structure 200 of FIG. 2a.

Contact openings at the bottom global word-lines are photo-lithographically patterned at the top of layer 202-7 and exposed by anisotropically etching through the charge-trapping materials at the bottom of trenches 230, stopping at the bottom global word-line landing pads (e.g., global word-line landing pads 264 of FIG. 2c). In one embodiment, to be described in conjunction with FIG. 2i below, only alternate rows of trenches 230 (e.g., the rows in which the word-lines formed therein are assigned odd-numbered addresses) should be etched down to the bottom global word-lines. In some embodiments, etching is preceded by a deposition of an ultra-thin film of polysilicon (e.g. 2-5 nm thick) to protect the vertical surface of the blocking dielectric on the sidewalls of trenches 230 during the anisotropic etch of the charge-trapping material at the bottom of trenches 230.

Figure 2F:
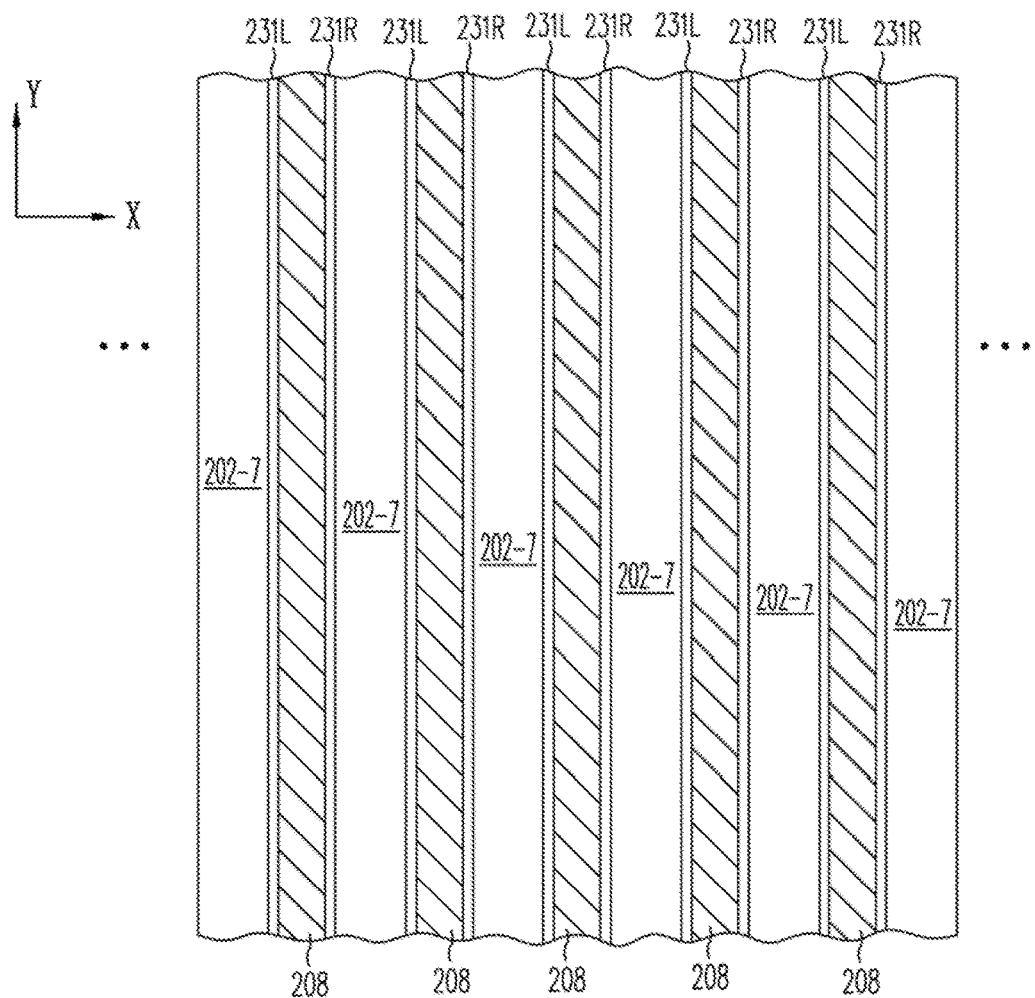
FIG. 2f illustrates depositing polysilicon or metal 208 to fill trenches 230.

Thereafter, doped polysilicon (e.g., $P^+$ polysilicon) may be deposited over the charge-trapping layers to form the control gates or vertical local word-lines. $P^+$ doped polysilicon is preferable because of its higher work function than N+ doped polysilicon. Alternatively, a metal with a high work function relative to $SiO_2$ (e.g., tungsten, tantalum, chrome or nickel) may also be used to form the vertical local word lines. Trenches 230 may now be filled with the $P^+$ doped polysilicon or the metal. In the embodiment of FIG. 2i, discussed below, the doped polysilicon or metal in alternate rows of trenches 230 (i.e., the rows to host local word-lines that are assigned odd-numbered addresses) is in ohmic contact with the bottom global word-lines. The polysilicon in the other ones of trenches 230 (i.e., the rows to host local word-lines that are assigned even-numbered addresses) are isolated from the bottom global word-lines. (These local word-lines are to be contacted by top global word-lines routed above the top active layer). The photoresist and hard mask may now be removed. A CMP step may then be used to remove the doped polysilicon from the top surface of each block. FIG. 2f illustrates depositing polysilicon 208 to fill trenches 230.

Figure 2G:
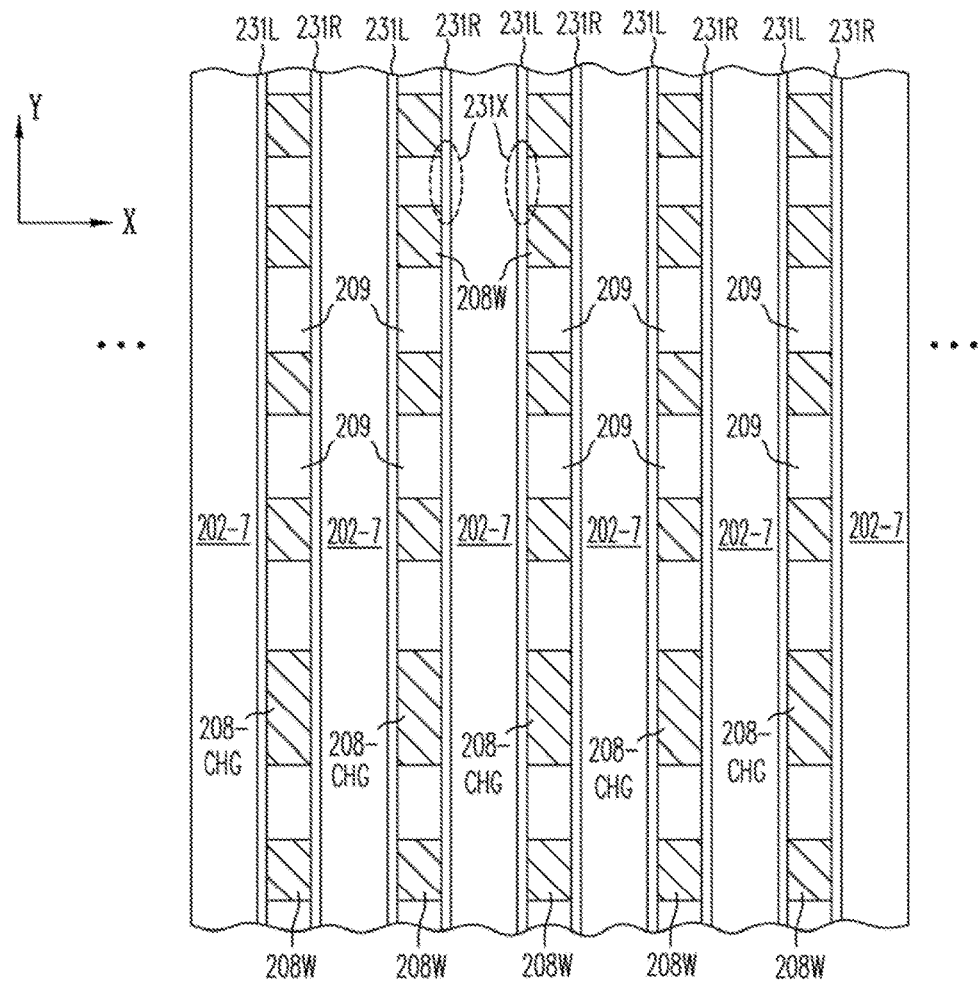
FIG. 2g shows, after photo-lithographical patterning and etching steps on the memory structure of FIG. 2f, local word-lines 208w and pre-charge word-lines 208-chg are achieved by removing exposed portions of the deposited polysilicon 208, and filling the resulting shafts with insulation material 209 or air gap isolation.

FIG. 2g shows, after photo-lithographical patterning and etching steps on the memory structure of FIG. 2f, local word-lines 208w are achieved by removing exposed portions of the deposited polysilicon 208, and filling the resulting shafts with insulation material 209. As the removal of the doped polysilicon in this instance is a high aspect-ratio etch in a rather confined space, a hard mask may be required, using the technique described above. The resulting shafts may be filled with insulation material 209 or left as an air gap. The mask pattern that exposes the doped polysilicon for excavation are parallel strips that run along the X direction, so that they coincide with the global word-lines that are required to be formed in one embodiment to contact local word-lines 208w.

In FIG. 2g, the portions of charge-trapping layers 231L and 231R adjacent insulation material 209 remained after the removal of the corresponding portions of deposited polysilicon 208. In some embodiments, those portions of charge-trapping layers 231L and 231R may be removed by a conventional etching process prior to filling the shafts with insulation material 209. Etching of the charge-trapping materials in the shafts may be carried out concurrently with the removal of the doped polysilicon, or subsequent to it. A subsequent etch would also remove any fine polysilicon stringers that the anisotropic etch has left behind; such polysilicon stringers may cause undesirable charge leakage, serving as resistive leakage paths between adjacent vertical local word-lines. Removal of such charge trapping material also eliminates lateral diffusion of trapped charge between one TFT and the TFTs immediately to its left and right along the same string.

Figure 2H:
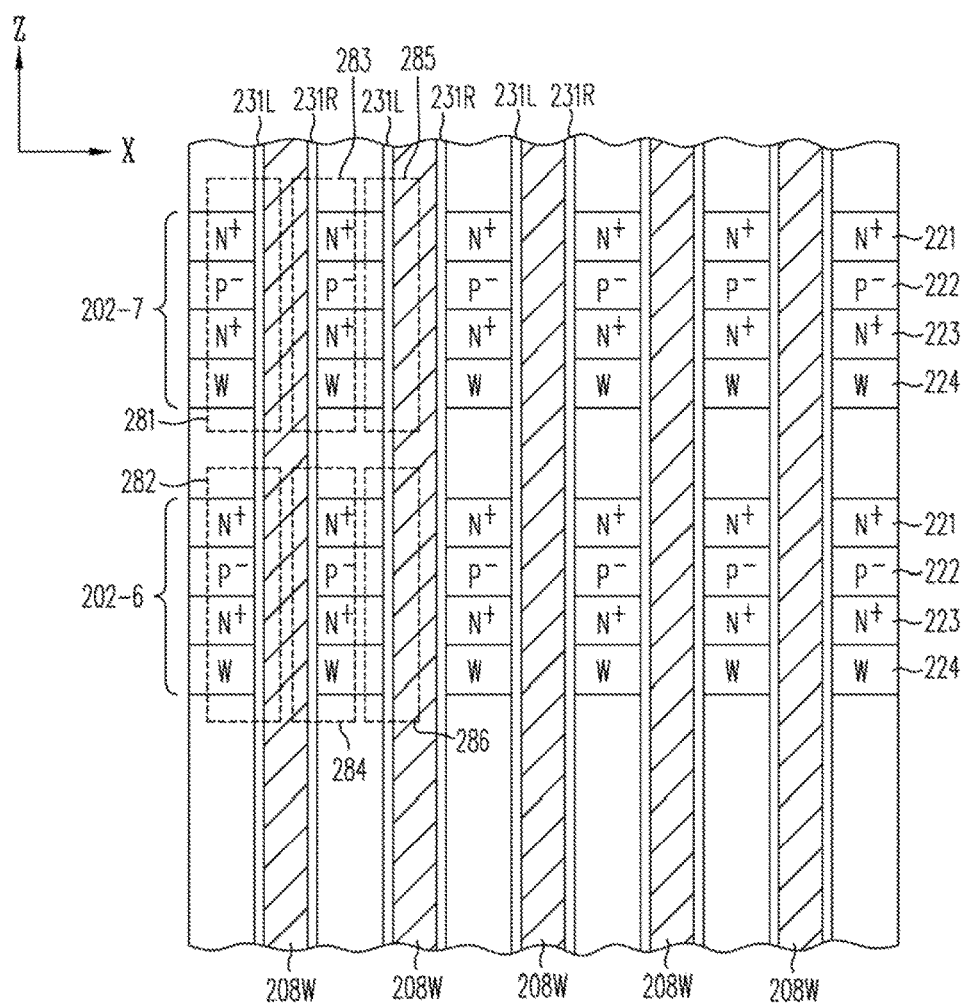
FIG. 2h shows a cross section in the X-Z plane through a row of local word-lines 208w of FIG. 2g, showing active strips in active layers 202-7 and 202-6.
Figure 2I:
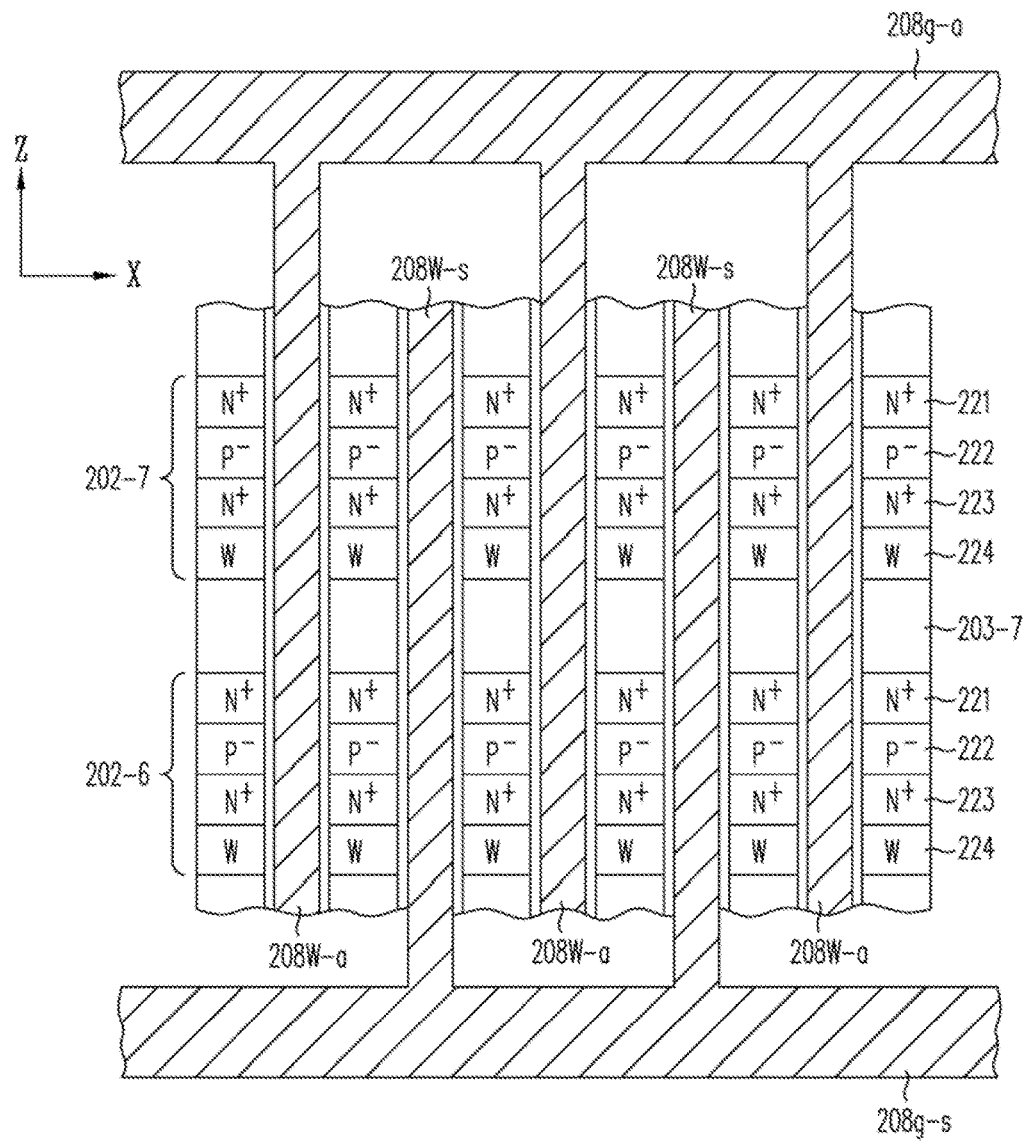
FIG. 2i shows that each of local word-lines 208w of FIG. 2h is connected to either one of global word-lines 208g-a, routed in one or more layers provided above active layers 202-0 to 202-7, or one of global word-lines 208g-s, routed in one or more layers provided below the active layers between active layer 202-0 and substrate 201 (see FIG. 4a).

FIG. 2h shows a cross section in the X-Z plane through a row of local vertical word-lines 208w (shown also in FIG. 2g in the X-Y plane), showing active strips in active layers 202-7 and 202-6. As shown in FIG. 2h, each active layer includes $N^+$ sublayer 221, $P^-$ sublayer 222, and $N^+$ sublayer 223. In one embodiment, N+ sublayer 221 (e.g., a source line) is connected to a ground reference voltage $V_{ss}$ (not shown) and $N^+$ sublayer 223 (e.g., a bit line) is connected to a contact in substrate 201 according to the method illustrated in FIG. 2c. Thus, local word-line 208w, the portion of active layer 202-7 or 202-6 facing word-line 208w and the charge-trapping layer 231L between word-line 208w and that portion of active layer 202-7 or 202-6 form a storage element or storage TFT, as indicated by reference numeral 281 and 282 in FIG. 2h. Facing TFTs 281 and 282 on the opposite side of 208W are TFTs 283 and 284 respectively, incorporating therein charge trapping layer 231R. On the other side of the active strips 202-6 and 202-7 providing TFTs 283 and 284 are TFTs 285 and 286. Accordingly, the configuration shown in FIG. 2h represents the highest packing density configuration for TFTs, with each vertical word-line shared by the two active strips along its sides, with each active strip being shared by the two word-lines along its sides. $N^+$ sublayer 223 can be charged to a suitable voltage required for an operation of the storage transistors at hand (e.g., program voltage $V_{prog}$, inhibition voltage $V_{inhibit}$, erase voltage $V_{erase}$, or the read reference voltage $V_{b1}$). As shown in FIG. 2h, additional metallic sublayer 224 increases the conductivity of the bit line, so as to facilitate memory device operations. In another embodiment, $N^+$ sublayer 221 in any of active layers 202-0 to 202-7 may be left floating. In each active layer, one or more of the local vertical word-lines (referred to as a "pre-charge word-line"; e.g., pre-charge word-lines 208-chg in FIG. 2g) may be used as a non-memory TFT. When a suitable voltage is applied (i.e., rendering the pre-charge TFT to the "on" state), each pre-charge word-line momentarily inverts sublayer 222, so that $N^+$ sublayer 221 may be pre-charged to the voltage $V_{ss}$ on $N^+$ sublayer 223. When the voltage on the pre-charge word-line is withdrawn, (i.e., returned to its "off" condition) and all the other word-lines on both sides of the strip are also "off", device operation may proceed with $N^+$ sublayer 221 left electrically charged as a virtual reference at the pre-charged voltage $V_{ss}$ because the parasitic capacitance in the strip capacitor of $N^+$ sublayer 221 is large enough to hold its charge sufficiently long to support program and read operations (see below).

Each local word-line 208w may be used to read, write or erase the charge stored in the designated one of the TFTs formed in each of active layers 202-0 to 202-7, located on either charge-trapping portion 231L or 231R, when a suitable voltage is imposed. Alternatively, in one embodiment, to be described in conjunction with FIG. 2k below, each local word-line 208w may be used to read, write or erase the charge stored in any of the TFTs formed in each of active layers 202-0 to 202-7, located on either charge-trapping portions 231L or 231R, when a suitable voltage is imposed. However, as shown in FIG. 2k, only one of the two sides of active layers 202-0 to 202-7 is formed as storage TFTs, thereby eliminating the need for both bottom and top global word-lines in the embodiment.

Figure 4A:
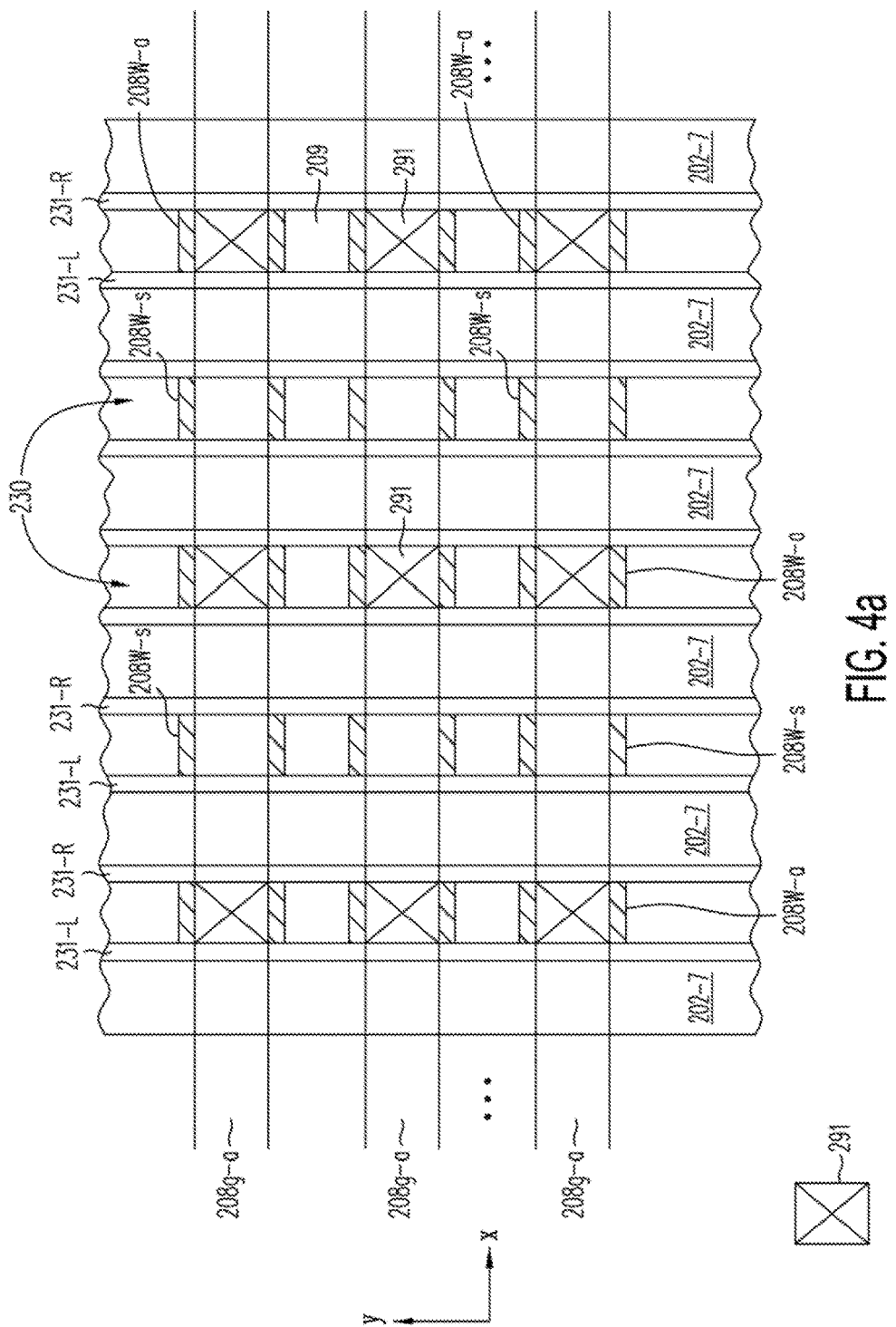
FIG. 4a shows a cross section in the X-Y plane, showing contacts 291 connecting local word-lines 208w to global word-lines 208g-a, for the embodiment of the present invention shown in FIG. 2i.
Figure 4B:
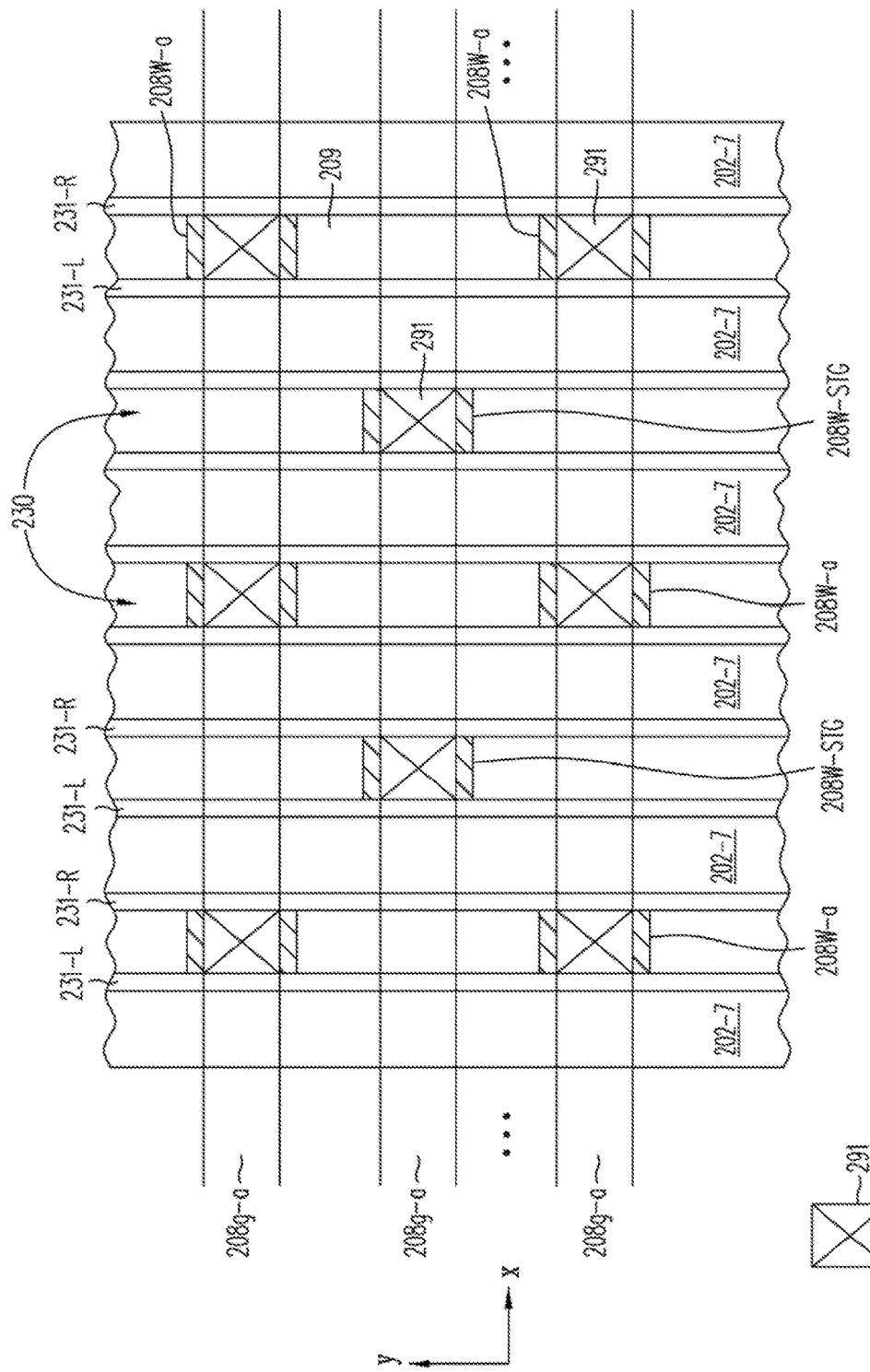
FIG. 4b shows a cross section in the X-Y plane, showing contacts 291 connecting local word-lines 208w to top global word-lines 208g-a (or bottom global word-lines 208g-s) in a staggered configuration, for the embodiment of the present invention shown in FIG. 2j.

An isolation dielectric or oxide may be then deposited and its surface planarized. Contacts to semiconductor substrate 201 and to local word-lines 208w may then be photo-lithographically patterned and etched. In one embodiment, which is described in conjunction with FIG. 2i and corresponding FIG. 4a, contacts to local word-lines 208w are provided only for those assigned an even-numbered address (local word-lines assigned an odd address are contacted from the bottom of the array by bottom global word-lines). For the embodiment shown in FIG. 2j, contacts are provided for every local word-line but the local word-lines are staggered relative to opposing word-lines, as shown in FIG. 4b. A deposited metal layer provides a top metal layer and the contacts. Such a metal layer may be provided by, first, forming a thin TiN layer, followed by forming a low resistance metal layer (e.g., tungsten). The metal layer is then photo-lithographically patterned to form top global word-lines. (Alternatively, these global word-lines may be provided by a copper damascene process.) In one embodiment, these global word-lines are horizontal, running along the X direction, electrically connecting with the contacts formed in the isolation oxide (i.e., thereby contacting local word-lines 208w) and with the contacts to semiconductor substrate 201 (not shown). Of course other mask and etch process flows known to those skilled in the art are possible to form even and odd addressed local word-lines and connect them appropriately to their global word-lines, either from the top of the array through the top global word-lines or from the bottom of the array through the bottom global word-lines and in some embodiments from both.

FIG. 2i shows that each of local word-lines 208w of FIG. 2h is connected to either one of global word-lines 208g-a, routed in one or more layers provided above active layers 202-0 to 202-7, or one of global word-lines 208g-s, routed in one or more layers provided below the active layers between active layer 202-0 and substrate 201. Local word-lines 208w that are coupled to bottom global word-lines may be assigned odd addresses, while local word-lines 208w coupled to the top global word-lines may be assigned even addresses. FIG. 4a shows a corresponding cross section in the X-Y plane, showing contacts 291 connecting local word-lines 208w to global word-lines 208g-a. (In contrast, in the embodiment of FIG. 2k and corresponding FIG. 4c, local word-lines 208w control each active strip on only one of the active strip's sides.)

Figure 2J:
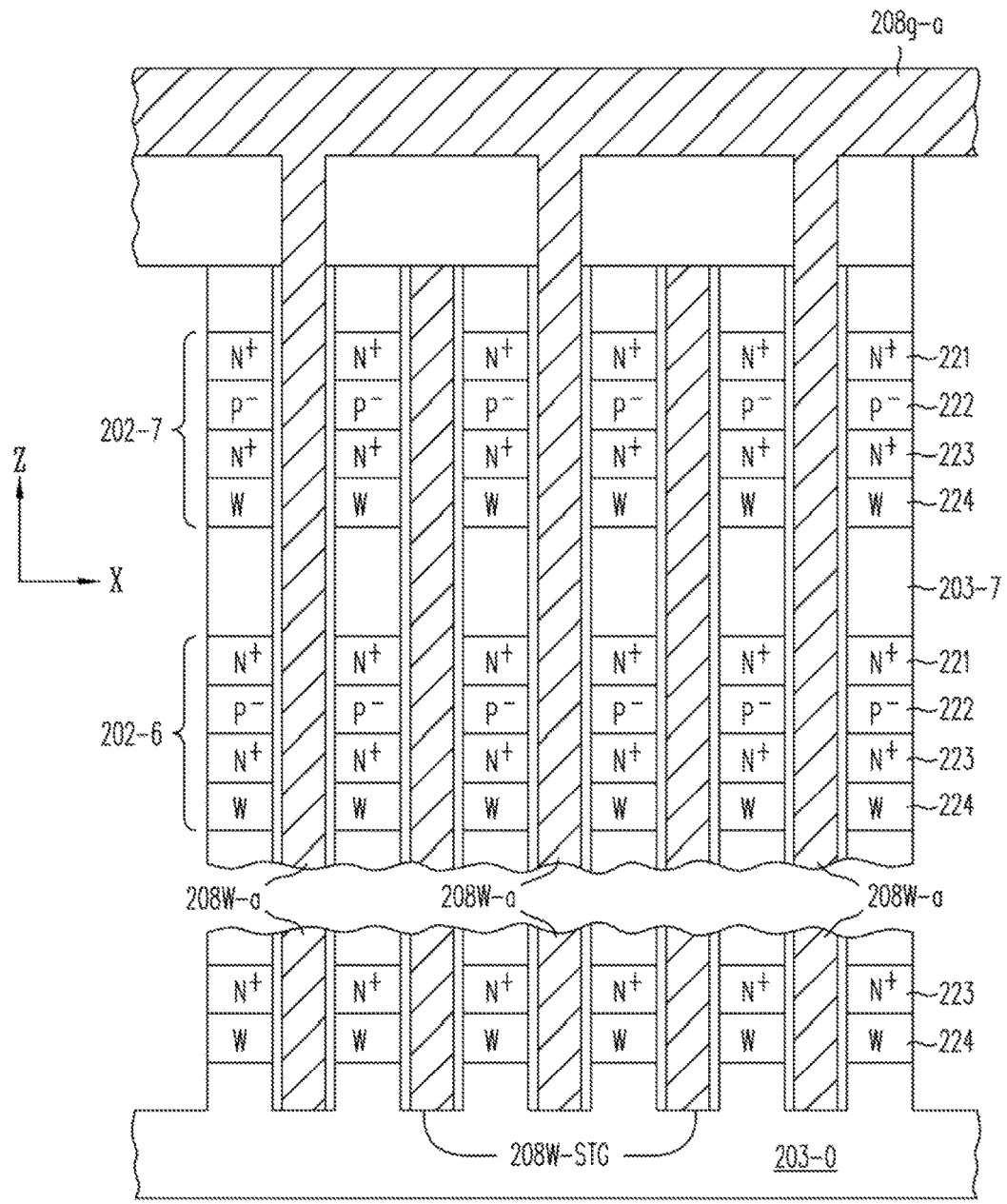
FIG. 2j shows an alternative embodiment to the embodiment of FIG. 2i, in which only top global word-lines—i.e., without any bottom global word-lines—are provided, in accordance with one embodiment of the present invention; in this embodiment, the local word-lines along one edge of an active strip are staggered with respect to the local word-lines on the other edge of the active strip (see FIG. 4b)
Figure 2K:
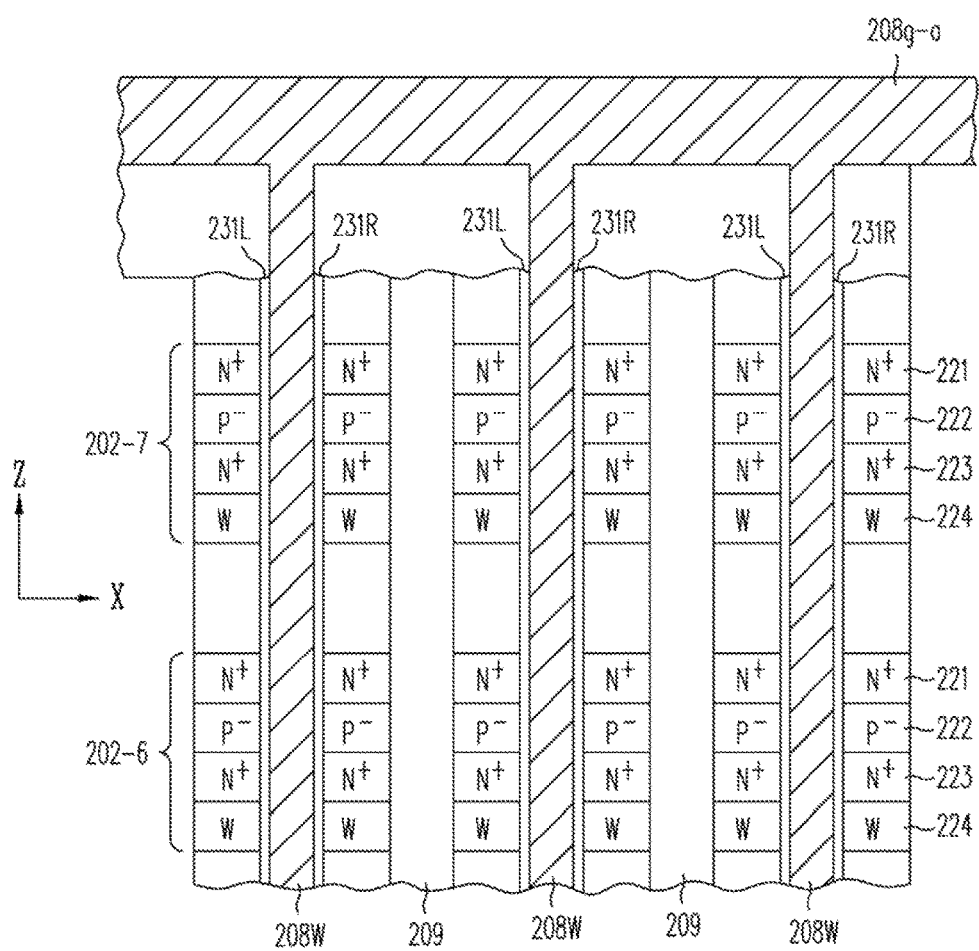
FIG. 2k shows each of local word-lines 208w controlling TFTs formed out of the active strips on opposite sides of the local word-line, according to one embodiment of the present invention (see FIG. 4c).
Figure 3:
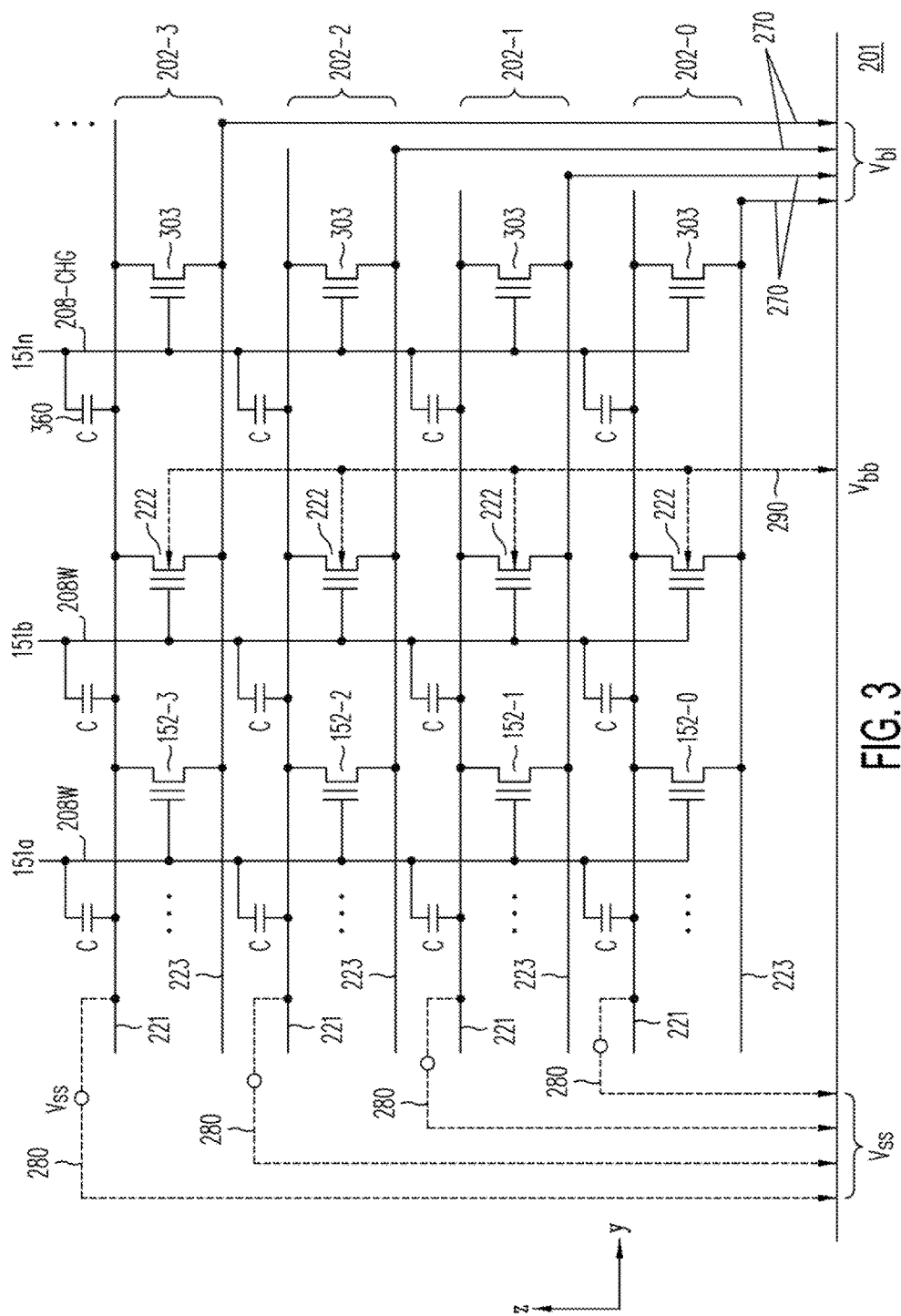

FIG. 2j shows an alternative embodiment to the embodiment of FIG. 2i, in which only top global word-lines are provided (or, alternatively, only bottom global word-lines are provided), in accordance with one embodiment of the present invention. In this embodiment, the local word-lines along one edge of an active strip are staggered with respect to the local word-lines on the other edge of the active strip. This is shown in FIG. 4b, which shows a corresponding cross section in the X-Y plane, showing contacts 291 connecting local word-lines 208w to top global word-lines 208g-a (or bottom global word-lines 208g-s) in a staggered configuration. This embodiment simplifies the process flow by obviating the process steps needed to form the bottom global word-lines (or the top global word-lines, as the case may be). In the embodiment of FIG. 2i and corresponding FIG. 4a, in which both top and bottom global word-lines are provided, two TFTs may be provided in each active layer of each active strip within one pitch of a global word-line (i.e., in each active strip, one TFT is formed using one sidewall of the active strip, and controlled from a bottom global word-line, the other TFT is formed using the other sidewall of the active strip, and controlled from a top global word-line). (A pitch is one minimum line width plus a required minimum spacing between adjacent lines). In contrast, as shown in FIG. 2j and corresponding FIG. 4b, only one TFT may be provided within one global word line pitch in each active layer. The two local word-lines 208w at the two sides of each strip can be staggered relative to each other so that two global word-line pitches are required to contact them both. The penalty for the staggered embodiment is the forfeiting of the double-density TFT inherent in having both edges of each active strip providing a TFT within one pitch of each global word-line.

Figure 4C:
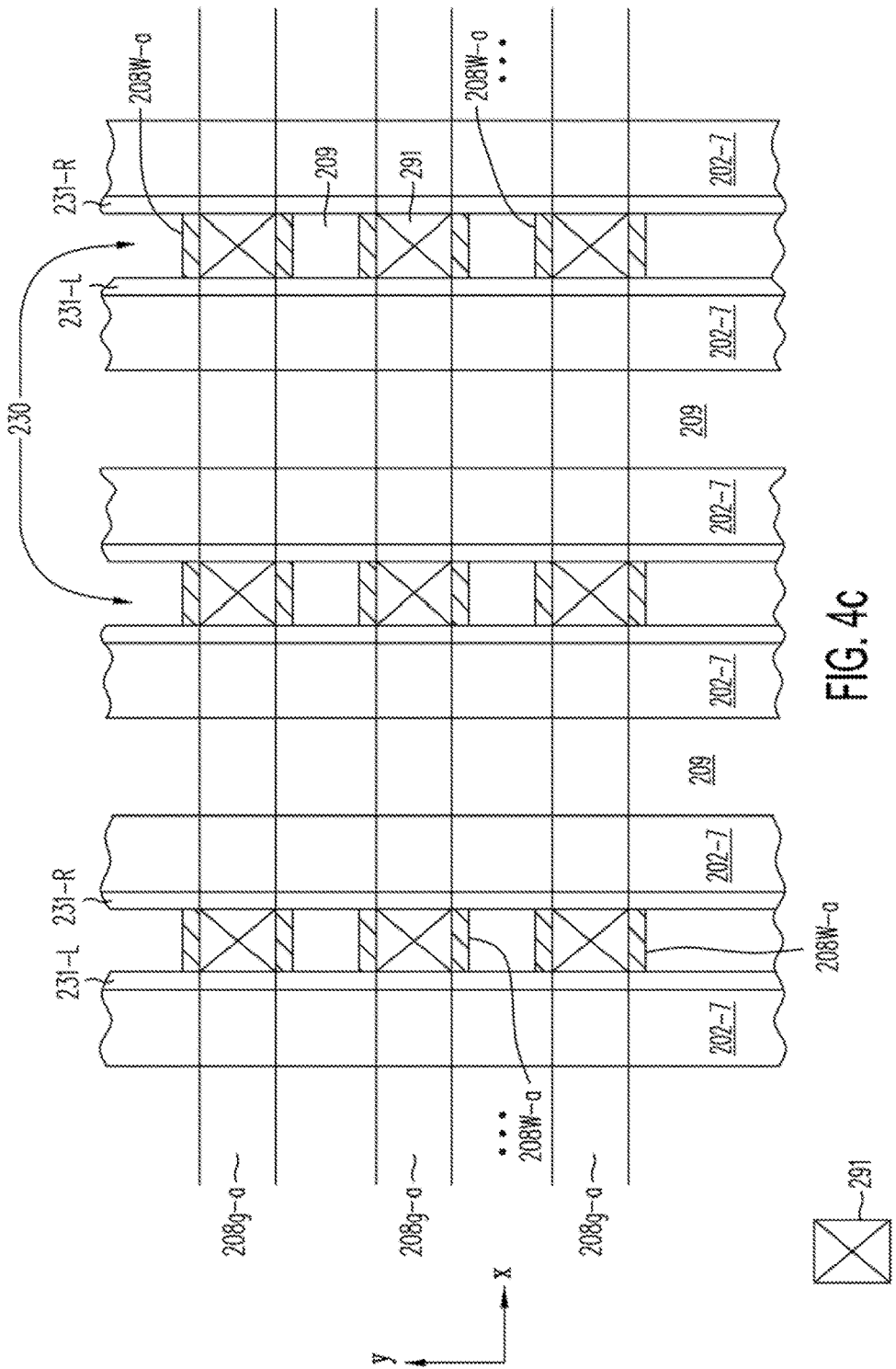
FIG. 4c shows a cross section in the X-Y plane, showing contacts 291 connecting local word-lines 208w to global word-lines 208g-a and the isolation 209 between adjacent active strip-pairs, for the embodiment of the present invention shown in FIG. 2k.

FIG. 2k shows each of local word-lines 208w controlling TFTs formed out of the active strips on opposite sides of the local word-line, according to one embodiment of the present invention. FIG. 4c shows a corresponding cross section in the X-Y plane, showing contacts 291 connecting local word-lines 208w to global word-lines 208g-a and the isolation 209 between adjacent active strip-pairs. As shown in FIG. 2k, each TFT is formed from either one of a dual-pair of active strips located on opposite side of a common local word-line, with each dual-pair of active strips being isolated by a trench filled with oxide or dielectric material or an air gap 209 from similarly formed adjacent dual-pairs of active strips. The isolation trenches between adjacent dual-pairs of active strips accommodate the charge-trapping-material 231 or polysilicon 208. After the local word-lines 208w are defined by etching, the protected isolation trenches may then be filled with oxide or dielectric material 209, or left as air gaps.

FIG. 3 shows schematically an embodiment where sublayer 221 of each active strip (see, e.g., FIG. 2b-1) is connected by hard wires 280 (dashed line) to a source reference voltage $V_{ss}$ by a metal or N+ doped polysilicon conductor. Each of hardwires 280 may be independently connected, so that the source voltages for different layers need not be the same. Since sublayer 221 is formed only after sublayer 223 is formed, the metal or N+ doped polysilicon conductor to connect sublayer 221 to the reference voltage $V_{ss}$ requires one or two additional patterning and etching steps to each of active layers 202-0 to 202-7, hence increasing the processing cost. To avoid this added cost, use is made of the large intrinsic parasitic capacitance C of each active NOR string. Taking advantage of intrinsic parasitic capacitance C, hard wires 280 are not needed and sublayer 221 of each active strip is left floating, after being temporarily pre-charged to voltage $V_{ss}$ transferred to it from bit-line sublayer 223 through the action of local vertical pre-charge TFTs that are controlled by pre-charge word-lines 208-chg. In a long horizontal NOR string (e.g., with 1,024 or more memory TFTs), several pre-charge TFTs may be provided on either side of the active strip (e.g., one every 512 TFTs). Assuming a local capacitor between each local word-line as one plate and N+/P-/N+ active layer as the other plate, each such TFT provides a capacitor that is typically around $3\times10^{18}$ farads. As there are slightly more than 2,000 TFTs contributing capacitance from both sides of the strip, the total capacitance C of the string is approaching 0.01 picofarad, which is sufficient to preserve the pre-charge voltage on it well beyond the milliseconds required for write, erase or read operations that follow immediately after a pre-charging operation. Capacitance C may be increased by lengthening the NOR string to accommodate thousands more TFTs along each side of the string, correspondingly increasing the retention time of pre-charge voltage $V_{ss}$ on $N^+$ sublayer 221. However, a longer NOR string suffers from an increased leakage current between $N^+$ sublayer 221 and $N^+$ sublayer 223, such leakage current may interfere with the sensed current when reading the one TFT being addressed. Also, the potentially longer time it takes to pre-charge a larger capacitor during a read operation can conflict with the requirement for a low read latency (i.e., a fast read access time). To speed up the pre-charging of the capacitance C of a long NOR string would typically require providing more than one pre-charge TFT; such pre-charge TFTs may be distributed throughout the length of the NOR string.

Also shown in FIG. 3 is an optional connection 290 to the P− sublayers 222 to access a back-bias voltage $V_{bb}$ from substrate 201. A negative $V_{bb}$ voltage can be used to modulate the threshold voltage of the TFTs along each active strip, so as to reduce the subthreshold leakage current between N+ source sublayer 221 and N+ drain sublayer 223. In some embodiments a high positive $V_{bb}$ voltage can be applied during an erase operation to tunnel-erase TFTs whose control gates are held at ground potential.

Because the TFTs in a NOR string are connected in parallel, the read operating condition for the NOR strings of the present invention should preferably ensure that all TFTs along both edges of an active strip operate in enhancement mode (i.e., they each have a positive threshold voltage between their control gate 151n and their source 221 voltage $V_{ss}$), so as to suppress the leakage current between $N^+$ sublayers 221 and 223 of the active strip when all control gates on both sides of the strip are held at, or below $V_{ss}$. This enhancement threshold voltage can be achieved by doping sublayer 222 with a P− dopant concentration (typically by boron, in a concentration typically between $1\times10^{16}$ and $1\times10^{17}$ per cm$^3$), so as to result in a native TFT threshold voltage of around 1 volt, and by holding all unaddressed local word-lines on both sides of the active strip at 0 volt. Alternatively, if some of the TFTs along an active string have negative threshold voltage (i.e in depletion mode threshold voltage), leakage current suppression can be achieved by raising the $V_{ss}$ voltage on $N^+$ sublayer 221 to around 1.5 volts and the voltage $V_{b1}$ on $N^+$ sublayer 223 to a voltage that is about half a volt to one volt above 1.5 volts, while holding all local word-lines at 0 volt. This provides the same effect as holding the word-line voltage at −1.5 volts with respect to the source, thereby suppressing any leakage due to TFTs that are in a slightly depleted threshold voltage. Also, after erasing a NOR string, the erase operation should preferably include a soft-programming operation that shifts any TFT that has been over-erased into a depletion mode threshold voltage back into an enhancement mode threshold voltage.

The charge-trapping material (e.g., an ONO stack) described above has a long data retention time (typically measured in many years), but low endurance. Endurance, which is a measure of a storage transistor's performance degradation after some number of write-erase cycles, is typically considered low if it is less than ten thousand cycles. However, one may alter the charge-trapping material to reduce retention times, but significantly increase endurance (e.g., reducing retention times to hours, while increasing endurance to tens of millions of write/erase cycles). For example, in an ONO film or a similar combination of charge-trapping layers, the tunnel dielectric, typically 6-8 nm of silicon oxide can be reduced to 2 nm or less of silicon oxide, or replaced altogether with another dielectric (e.g., silicon nitride or SiN). Under a modest positive control gate voltage, electrons will be attracted through direct tunneling (as distinct from Fowler-Nordheim tunneling) into the silicon nitride charge-trapping layer where the electrons will be temporarily trapped for a few minutes to hours or days. The charge-trapping silicon nitride layer and the blocking layer of silicon oxide or aluminum oxide will keep these electrons from escaping to the control gate word-line, but they will eventually leak back out to the active sublayers (electrons are negatively charged and repel each other). Even if the 2 nm or less tunnel dielectric breaks down locally after extended cycling, the trapped electrons will be slow to depart from their traps in the silicon nitride layer. Other combinations of charge storage materials may also result in a high endurance but low retention ("semi-volatile") TFT. Such a TFT may require periodic write refresh to replenish the lost charge. Because such a TFT provides a relatively fast read access time with a low latency, NOR string arrays of the present invention that have such TFTs may be useful in applications that currently can get by with relatively slow DRAMs. The advantages of such NOR string arrays over DRAMs include: a much lower cost-per-bit because DRAMs cannot be built in three dimensional blocks, and a much lower power dissipation, as the refresh cycles need only be run approximately once every few minutes or once every few hour, as compared to every few milliseconds required in current DRAM technology. The NOR string arrays of the present invention are achieved by changing the constitution of the charge-trapping material (e.g., charge-trapping layers 231L and 231R in FIG. 2e), and by appropriately adapting the program/read/erase conditions to incorporate the periodic data refreshes.

According to another embodiment of the present invention, NOR string arrays may also be programmed using a channel hot-electron injection approach, similar to that which is used in NROM/Mirror Bit transistors, known to those of ordinary skill in the art. In an NROM/Mirror Bit transistor, charge representing one bit is stored at one end of the channel region next to the junction with the drain region, and by reversing polarity of the source and drain, charge representing a second bit is programmed and stored at the opposite end of the channel region next to the source junction. Typical programming voltages are 5 volts on the drain, 0 volt on the source and 8 volts on the control gate. Reading both bits requires reading in reverse the source and drain, as is well known to those skilled in the art. However, channel hot electron programming is much less efficient than tunnel programming, and therefore the method does not lend itself to the massively parallel programming possible by tunneling. The channel hot electron injection approach provides double the bit density though, making it attractive for applications such as archival memory.

Exemplary operations for the NOR strings of the present invention are next described.

Read Operation

To read a TFT among the many TFTs on an active strip, the TFTs on both sides of the active strip are initially set in an "off" state, so that all global and local word-lines in a selected block are initially held at 0 volts. In FIG. 3, the addressed NOR string can either share a sensing circuit among several NOR strings through a decoding circuitry, or each NOR string may be directly connected to a dedicated sensing circuit and many other addressed NOR strings sharing the same plane can be sensed in parallel. Each addressed NOR string has its source ($N^+$ sublayer 221) set at $V_{ss}$~0V, either through hard-wire 280 or through bit-line connection 270 in conjunction with pre-charge word-line 208-*chg* (in this case $V_{b1}$ is initially held at 0 volt during a pre-charge phase). After the pre-charge phase, the bit-line (i.e., N+ sublayer 223) is then set to around $V_{b1}$~2 volts through bit-line connection 270. The $V_{b1}$ voltage is the sense voltage at the sense amplifiers for the addressed NOR strings. The one addressed global word-line and all its associated vertical local word-lines are raised from 0 volts to typically around 2 volts while all other global word lines in the block are in their off state. If the addressed TFT is in an erased state (i.e., $V_{th}$~1 volt), bit-line voltage $V_{b1}$ will begin to discharge toward source voltage $V_{ss}$. This voltage dip is detected by the respective sense amplifier. However, if the addressed TFT is in a programmed state (e.g, $V_{th}$~3 volts) no dip is detected.

When MLC is used (i.e., more than one bit of information is stored in each TFT), the addressed TFT may be programmed to any of several threshold voltages (e.g., 1 volt (for an erased state), 2.5 volts, 4 volts or 5.5 volts for the four states representing two bits of data). The addressed global word-line and its local word-lines can be raised in incremental voltage steps until conduction is detected in the addressed TFT by the respective sense amplifier. Alternatively a single word-line voltage $V_{b1}$ can be applied (e.g. $V_{b1}$=6 volts), and the rate of discharge of voltage $V_{b1}$ can be compared with the rate of discharge of each of several programmable reference voltages representative of the four voltage states representing the bits stored in the TFT. This approach can be extended to store eight states (for 3-bit MLC TFT) or a continuum of states, thereby effectively providing analog storage. The programmable reference voltages are stored on NOR strings dedicated as reference NOR strings in the same block, preferably located in the same plane as the addressed NOR string. When MLC is used, more than one programmable reference NOR string may be provided to detect each of the programmed states. For example, if 3-bit MLC is used, there should be at least seven reference NOR strings; preferably, an entire set of reference NOR strings should be provided for each active layer and each block. The programmable reference NOR strings closely track the characteristics of the operating NOR strings in the same block through read, program, and background leakage. Only TFTs on one of the two sides of the active strip can participate in a read operation; each TFT on the other side of an active strip must be set to the "off" state. Other ways to read the correct state of a multi-state TFT, as are known to those skilled in the art.

Reading is fast because, in a NOR string, only the TFT to be read is required to be "on", as compared to a NAND string, in which the TFTs in series with the one TFT being read must also be "on". In the embodiments in which metal sublayer 224 is not provided in the active layer (see, e.g., 220a of FIG. 2b-1), for a string with 1,024 TFTs on each side, a typical resistance R is ~100,000 Ohm and a typical capacitance C~$10^{14}$ farad, to provide a RC time delay in the order of one nanosecond. Even with 4,098 TFTs in each NOR string on either side of an active strip, the RC time delay would still be less than 20 nanoseconds. The time delay may be much reduced, if metal sublayer 224 is provided to reduce the resistance R of the active strip. To further reduce read latency, some or all the planes in selected active blocks may be kept always pre-charged to their read voltages $V_{ss}$ and $V_{b1}$, thereby rendering them ready to immediately sense the addressed TFT (i.e., obviating the pre-charge phase immediately before the read operation). Such ready-standby requires very little standby power because the current required to periodically re-charge capacitor C to compensate for charge leakage is very small. Within each block, all strings on all eight or more planes can be pre-charged to be ready for fast read; for example, after reading all strings in plane 207-0 (FIG. 2a), plane 207-1 can be read in short order because its $V_{ss}$ and $V_{b1}$ are already previously set for a read.

In memory block 100, only one TFT per NOR string can be read in a single operation. In a plane with eight thousand NOR strings, the eight thousand TFTs that share a common global word-line may all be read concurrently, provided that each NOR string is connected to its own sense amplifier. If each sense amplifier is shared among, for example, four NOR strings in the same plane using a string decode circuit, then four read operations are required to take place in four successive steps, with each read operation involving two thousand TFTs. Each plane can be provided its own set of dedicated sense amplifiers or, alternatively one set of sense amplifiers can be shared among NOR strings in the eight or more planes through a plane-decoding selector. Providing separate sense amplifiers for each plane allows concurrent read operations of NOR strings of all planes, which correspondingly improves the read throughput. However, such throughput comes at the expense of the extra chip area needed for the additional sense amplifiers, and may also create ground voltage bounces when too many TFTs are read all at once. In that regard, embodiments relying on pre-charged capacitor C to set the virtual $V_{ss}$ voltage are particularly advantageous, as it eliminates such ground voltage bounces because source voltage $V_{ss}$ of all NOR strings is not connected to the chip's $V_{ss}$ ground line.

Program (Write) and Program-Inhibit Operations

There are several ways to program an addressed TFT to its intended threshold voltage. The most common way is by tunneling, i.e., either direct tunneling or Fowler-Nordheim tunneling. Either one of these tunneling and charge-trapping mechanisms is highly efficient, so that very little current is needed to program a TFT, allowing parallel programming of tens of thousands of TFTs with minimal power dissipation. For illustration purpose, let us assume that programming by tunneling requires a 20 volts pulse of 100 microseconds (us) duration to be applied to the addressed word-line (control gate), with 0 volts applied to the active strip (e.g., 202-0 in FIG. 2a). Under these conditions N+ source and drain (sublayers 221, 223 in FIG. 2b-1) and the P− channel (sublayer 222) of the TFT is inverted at the surface and electrons tunnel into the charge trapping layer. TFT Programming can be inhibited by applying a half-select voltage (e.g., 10 volts, in this example). Program-inhibit can be accomplished, for example, either by lowering the word-line voltage to 10 volts while keeping the strip voltage at 0 volt, or by raising to 10 volts the active strip voltage, while keeping the word-line voltage at 20 volts, or some combination of the two. Only one TFT on an addressed active strip can be programmed at one time, but TFTs on other strips can be programmed in parallel in the same programming cycle. When programming one of the many TFTs on one side of an addressed active strip (e.g., one TFT in the even-addressed NOR string), all other TFTs in the NOR strings are programming-inhibited, as are all TFTs on the other side of the active strip (e.g., all TFTs in the odd-addressed NOR string). Once the addressed TFT is programmed to the target threshold voltage of its designated state, programming-inhibition of that TFT is required, as overshooting that target voltage will exert unnecessary stress on the TFT. When MLC is used, overshooting the target voltage may cause overstepping or merging with the threshold voltage of the next higher target threshold voltage state. It should be noted that all TFTs in the adjacent active strips on the same plane sharing the same global word-line and its associated local word-lines—thus, are exposed to the 20 volts programming voltage—and are required to be programming-inhibited once they have been programmed to their target threshold voltages. Similarly, all TFTs on other planes that are within the same block and that share the same global word-line and its associated local word-lines—and thus, are also exposed to the 20 volts programming voltage—are also required to be programming-inhibited. These program and program-inhibit conditions can all be met under the present invention because the even and odd sides of each active strip are controlled by different global word-lines and their associated local word-lines, and because the voltage on each active strip regardless of its plane can be set independently from all other active strips or other planes.

In one example, all TFTs in a block are first erased to a threshold voltage of around 1 volt. The voltage on the active strip of each addressed TFT is then set to 0 volts (e.g., through connection 270 in conjunction with pre-charge word-line 208-*chg*, or through connection 280, as illustrated in FIG. 3), if the addressed TFT is to be programmed; otherwise, the voltage on the active strip of the addressed TFT is set to 10 volts if it is to remain in its erased state (i.e., program-inhibited). The global word-line associated with the addressed TFT is then raised to 20 volt, either in one step or in short-duration steps of incrementally increasing voltages, starting at around 14 volts. Such incremental voltage steps reduce the electrical stress across the TFT and avoid overshooting the target threshold voltage. All other global word-lines in the block are set at half-select 10 volt. All active strips on all planes that are not being addressed in the block, as well as all active strips within the addressed plane that are not individually addressed, are also set at 10 volts, or may be floated. These active strips are strongly capacity-coupled to the local word-lines, which are at 10 volts, and thus float at close to 10 volts. Each of the incrementally higher voltage programming pulses is followed by a read cycle to determine if the addressed TFT has reached its target threshold voltage. When the target threshold voltage is reached, the active strip voltage is raised to 10 volts (alternatively the strip is floated, and rises close to 10 volts when all but the one addressed global word lines in the block are raised to 10 volt) to inhibit further programming, while the global word-line keeps programming other addressed strips on the same plane that have not yet attained their target threshold voltages. This programming sequence terminates when all addressed TFTs have been read-verified to be correctly programmed. When MLC is used, programming of the correct one of the multiple threshold voltage states can be accelerated by first pre-charging capacitor C of all addressed active strips (see, e.g., through connection 270 and pre-charge word-line 208-*chg* of FIG. 3) to one of several voltages (e.g., 0, 1.5, 3.0, or 4.5 volts, when two bits of information are to be stored in each TFT). 20 volt pulses are then applied to the addressed global word-line, which expose the TFT to different effective tunneling voltages (i.e., 20, 18.5, 17, or 15.5 volts, respectively), resulting in the correct one of the four threshold voltages being programmed in a single course programming step. Thereafter, fine programming pulses may then be applied at the individual TFT level.

Because of the intrinsic capacitance C of every active strip in the block, all active strips on all planes in a block can have their pre-charge voltage states set in place in advance of applying the high voltage pulsing on the addressed global word-line. Consequently, concurrent programming of a great many TFTs can be achieved. Thereafter, individual read-verify, and where necessary, resetting properly programmed active strips into program-inhibit mode can be carried out. Pre-charging is advantageous, as programming time is relatively long (e.g., around 100 microsecond) while pre-charging all capacitors C or read-verifying of addressed TFTs can be carried out over a time period that is more than 1,000 times shorter. Thus, it is advantageous to program as many TFTs as possible in a single global word-line programming sequence.

Erase Operation

With some charge-trapping layers, erase is accomplished through reverse-tunneling of the trapped charge, which can be rather slow (e.g., may require tens of milliseconds of erase pulsing). Therefore, the erase operation is frequently implemented at the block level, often in the background. A typical block may be eight planes high with each plane having 8,000 active strips each with 4,000 TFTs on either of its sides, for a total of half a billion TFTs in a block, so that a one-terabit chip includes approximately 1,000 such blocks, if two bits of information are stored on each TFT. Ideally, block erase is carried out by applying around 20 volts to the P− sublayer 222 (see, e.g., FIG. 2*b*-1) of every active strip through connection 290 (see, e.g., FIG. 3) while holding all global word-lines in the block at 0 volts. The duration of an erase pulse should be such that most TFTs are erased to a slight enhancement mode threshold voltage, between zero and one volts. Some TFTs may overshoot and be erased into depletion mode (i.e., having a slightly negative threshold voltage). Such TFTs are required to be programmed into a slight enhancement mode threshold voltage subsequent to the termination of the erase pulses, as part of the erase command.

Alternatively, in lieu of $V_{bb}$ applied to P− sublayer, sublayers 221 and 223 on all active strips are raised to around 20 volts while holding all global word-lines at zero volt for the duration of the erase pulse. This scheme requires that strip-select decoders (206-0, 206-1 in FIG. 2*c*) employ transistors that can withstand the 20 volts at their junctions. Alternatively, all but the addressed global word-line are held at zero volts, while pulsing the addressed global word-line to −20 volts and holding all active strips in planes 202-0 through 202-7 at zero volts. This method erases only the X-Z slice of all TFTs touched by the one addressed global bit line.

Erase for the NROM TFT embodiment can be achieved using the conventional NROM erase mechanism of band-to-band tunneling-induced hot hole injection. To neutralize the charge of the trapped electrons: apply −5 volts on the word-line, zero volts on source sublayer 221 and 5 volts on drain sublayer 223.

The above detailed description is provided to illustrate specific embodiments of the present invention and is not intended to be limiting. Numerous variations and modification within the scope of the present invention are possible. The present invention is set forth in the accompanying claims.

The invention claimed is:

1. A NOR string array formed over a planar surface of a semiconductor substrate, comprising a first NOR string and a second NOR string, each NOR string comprising thin-film storage transistors formed along an active strip extending lengthwise along a first direction parallel to the planar surface, wherein the thin film storage transistors in each NOR string share a pre-charge device, a common drain terminal and a common source terminal, wherein a gate terminal of each storage transistor in the first NOR string is electrically connected to a gate terminal of a corresponding storage transistor in the second NOR string by a conductor that extends lengthwise along a second direction which is substantially perpendicular to the planar surface, and wherein the pre-charge device pre-charges the common source terminal to a voltage that is substantially held by virtue of a parasitic capacitance in the source terminal during a program, program-inhibit, reading or erasing operation on the NOR string, further comprising a third NOR string, wherein the first NOR string and the third NOR string are formed on a plane parallel the planar surface, wherein one or more storage transistors on the third NOR string are programmed to have reference threshold voltages, which are compared to threshold voltages of storage transistors in the first NOR string during programming or read operations.

2. The NOR string array of claim 1, wherein the active strip of the first NOR string and the active strip of the second NOR string are both formed on a plane parallel to the planar surface.

3. The NOR string array of claim 1, wherein the third NOR string provides a reference string leakage current source by setting all the storage transistors of the third NOR string are in an off state.

4. The NOR string array of claim 1, further comprising a plurality of reference NOR strings, wherein when the storage transistors of the first NOR string are programmed according to a multibit scheme, the reference NOR strings each provide a reference for a different state of the multibit scheme.

5. The NOR string array of claim 1, wherein the conductor comprises one of $N^+$ doped polysilicon, $P^+$ doped polysilicon, and a refractory metal of a high work function with respect to silicon dioxide.

6. The NOR string array of claim 1, wherein the common drain terminal comprises a semiconductor layer and a metallic layer that is in electrical contact with, and in substantial alignment lengthwise with, the semiconductor layer.

7. The NOR string array of claim 1, wherein each active strip has a first side-edge and a second side-edge on opposite sides of the active strip, wherein an independently controlled NOR string is formed along each side-edge.

8. The NOR string array of claim 1, further comprising a first global wiring which is in electrical contact with the conductor and which extends lengthwise along a third direction that is substantially orthogonal to both the first and second direction.

9. The NOR string array of claim 8, wherein support circuitry for memory operations is formed on or in the semiconductor substrate and wherein the first global wiring conducts electrical signals from the support circuitry to the conductor.

10. The NOR string array of claim 9, wherein the support circuitry comprises voltage sources for providing the configurations of voltages to be imposed on the terminals of each storage transistors, so as to effectuate program charging, program-inhibit charging, reading or erasing data stored in the storage transistor.

11. The NOR string array of claim 8, wherein the first global wiring is formed between the semiconductor substrate and the active strip of the first NOR string.

12. The NOR string array of claim 8, wherein the NOR string array further comprises a second global wiring formed above the active strip of the first NOR string, the first and second global wirings are in electrical contact with gate terminals of different storage transistors of the first NOR string.

13. The NOR string array of claim 1, wherein the pre-charge device equalizes the voltages of the common source terminal and the common drain terminal.

14. The NOR string array of claim 12, wherein the common drain terminal is charged to one of several predetermined voltages prior to turning on the pre-charge device, the predetermined voltage being selected from one of: program, program-inhibit, reading and erasing data of the storage transistors.

15. The NOR string array of claim 1, wherein the common source terminal serves as a shared virtual ground reference and the common drain terminal serves as a common bit line for the storage transistors in each NOR string.

16. A NOR string array formed over a planar surface of a semiconductor substrate, comprising a first NOR string and a second NOR string, each NOR string comprising thin-film storage transistors formed along an active strip extending lengthwise along a first direction parallel to the planar surface, wherein the thin film storage transistors in each NOR string share a pre-charge device, a common drain terminal and a common source terminal, wherein a gate terminal of each storage transistor in the first NOR string is electrically connected to a gate terminal of a corresponding storage transistor in the second NOR string by a conductor that extends lengthwise along a second direction which is substantially perpendicular to the planar surface, and wherein the pre-charge device pre-charges the common source terminal to a voltage that is substantially held by virtue of a parasitic capacitance in the source terminal during a program, program-inhibit, reading or erasing operation on the NOR string, wherein the first NOR string and the second NOR string are formed on first and second planes parallel to the planar surface, respectively, the NOR string array further comprising one or more reference NOR strings on each of the first and second planes, and wherein for each of the reference NOR strings, one or more storage transistors on the reference NOR string are programmed to have reference threshold voltages, which are compared during programming and read operations to threshold voltages of storage transistors in the corresponding NOR string on the same plane as the reference NOR string.

* * * * *